US012663485B2

(12) United States Patent
Schmitt et al.

(10) Patent No.: US 12,663,485 B2
(45) Date of Patent: Jun. 23, 2026

(54) SYSTEMS AND METHODS FOR MONITORING ELECTRICAL FUSES

(71) Applicant: Eaton Intelligent Power Limited, Dublin (IE)

(72) Inventors: Thomas E. Schmitt, Collinsville, IL (US); Venancio Esteban Narciso, Juarez (MX); Arturo Gutierrez Ramos, Juarez (MX); Jacob Nuñez Lopez, Juarez (MX)

(73) Assignee: EATON INTELLIGENT POWER LIMITED, Dublin (IE)

( * ) Notice: Subject to any disclaimer, the term of this patent is extended or adjusted under 35 U.S.C. 154(b) by 294 days.

(21) Appl. No.: 18/509,146

(22) Filed: Nov. 14, 2023

(65) Prior Publication Data

US 2024/0085496 A1    Mar. 14, 2024

Related U.S. Application Data

(63) Continuation of application No. 17/749,570, filed on May 20, 2022, now Pat. No. 11,867,719.

(51) Int. Cl.
  *G01R 31/74* (2020.01)
  *H01H 85/02* (2006.01)
(52) U.S. Cl.
  CPC ......... *G01R 31/74* (2020.01); *H01H 85/0241* (2013.01); *H01H 2085/0266* (2013.01)
(58) Field of Classification Search
  CPC ............... G01R 31/74; H01H 85/0241; H01H 2085/0266; H01H 85/30; H01H 2085/0275; H01H 85/2045; H01H 2085/0291; H02H 3/04
  See application file for complete search history.

(56) References Cited

U.S. PATENT DOCUMENTS

| | | | |
|---|---|---|---|
| 4,616,207 A | 10/1986 | Knapp | |
| 6,052,059 A | 4/2000 | Jaeger | |
| 11,009,143 B1 * | 5/2021 | Brookins | ............ F15B 13/0817 |
| 2006/0128233 A1 * | 6/2006 | Matsuura | ............ H01R 13/113 |
| | | | 439/845 |

(Continued)

FOREIGN PATENT DOCUMENTS

| | | | |
|---|---|---|---|
| DE | 29705224 U1 | 6/1997 | |
| EP | 3467865 A1 * | 4/2019 | ............ H01H 85/30 |

OTHER PUBLICATIONS

EESR received for EP Application No. EP23172417.0, mailed on Oct. 16, 2023, 8 pages.

*Primary Examiner* — Lee E Rodak
*Assistant Examiner* — Zannatul Ferdous
(74) *Attorney, Agent, or Firm* — Eckert Seamans Cherin & Mellott, LLC

(57) ABSTRACT

A fuse monitoring device for monitoring a fuse is disclosed. The fuse monitoring device includes at least one sensor, at least one processor and a housing. The sensor is configured to be operably connected to the fuse and configured to measure fuse data associated with the fuse. The sensor includes a current sensor that includes a frame and a core. The at least one processor is communicatively coupled to the at least one sensor and is configured to transmit the fuse data. The housing includes a mounting block that includes an inner opening. The frame of the current sensor is configured within the inner opening of the mounting block.

19 Claims, 28 Drawing Sheets

(56)              References Cited

U.S. PATENT DOCUMENTS

| 2010/0246080 | A1 | 9/2010 | Nelson |
| 2012/0019345 | A1* | 1/2012 | von zur Muehlen ........................ H01H 85/204 337/214 |
| 2017/0103866 | A1* | 4/2017 | Zhou ...................... H01F 7/0273 |
| 2017/0363674 | A1* | 12/2017 | Douglass ............... H01H 85/17 |
| 2020/0182712 | A1* | 6/2020 | Kleczewski ............. G01G 7/00 |

* cited by examiner

480

SYSTEMS AND METHODS FOR MONITORING ELECTRICAL FUSES

PRIORITY

This application is a continuation under 35 U.S.C. § 120 of U.S. patent application Ser. No. 17/749,570, filed 20 May 2022, which is incorporated herein by reference.

BACKGROUND

The field of the disclosure relates generally to monitoring systems for electrical power systems, and more particularly to systems, assemblies, and methods for monitoring of electrical circuit protection fuses.

Fuses are widely used as overcurrent protection devices to prevent costly damage to electrical circuits. Fuse terminals typically form an electrical connection between an electrical power source or power supply and an electrical component or a combination of components arranged in an electrical circuit. One or more fusible links or elements, or a fuse element assembly, is connected between the fuse terminals, so that when electrical current flowing through the fuse exceeds a predetermined limit, the fusible elements melt and open one or more circuits through the fuse to prevent electrical component damage. In order to complete electrical connections to external circuits, a variety of fuse blocks have been made available that define fuse receptacles or compartments to receive overcurrent protection fuses and are provided with line and load-side fuse contact members to establish electrical connection through the fusible elements in the fuse.

Fuse failure may either be a nuisance or result in an emergency. In some applications, electrical enclosures house electrical components such as fuses inside. For example, in hazardous industrial environments such as mines, refineries and petroleum chemical plants, ignitable gas, vapors, dust or otherwise flammable substances are present in the ambient environment of the electrical enclosure, and the electrical enclosures are subject to temperature fluctuations, humidity, potentially causing fuse fatigue and decreasing the service life of the fuse.

Known fuse monitoring systems are disadvantaged in some aspect to meet the needs of challenging applications such as those described, they remain disadvantaged and improvements are desired.

BRIEF DESCRIPTION OF THE DRAWINGS

Non-limiting and non-exhaustive embodiments are described with reference to the following FIGs., wherein like reference numerals refer to like parts throughout the various drawings unless otherwise specified.

DETAILED DESCRIPTION

Figure 1A:
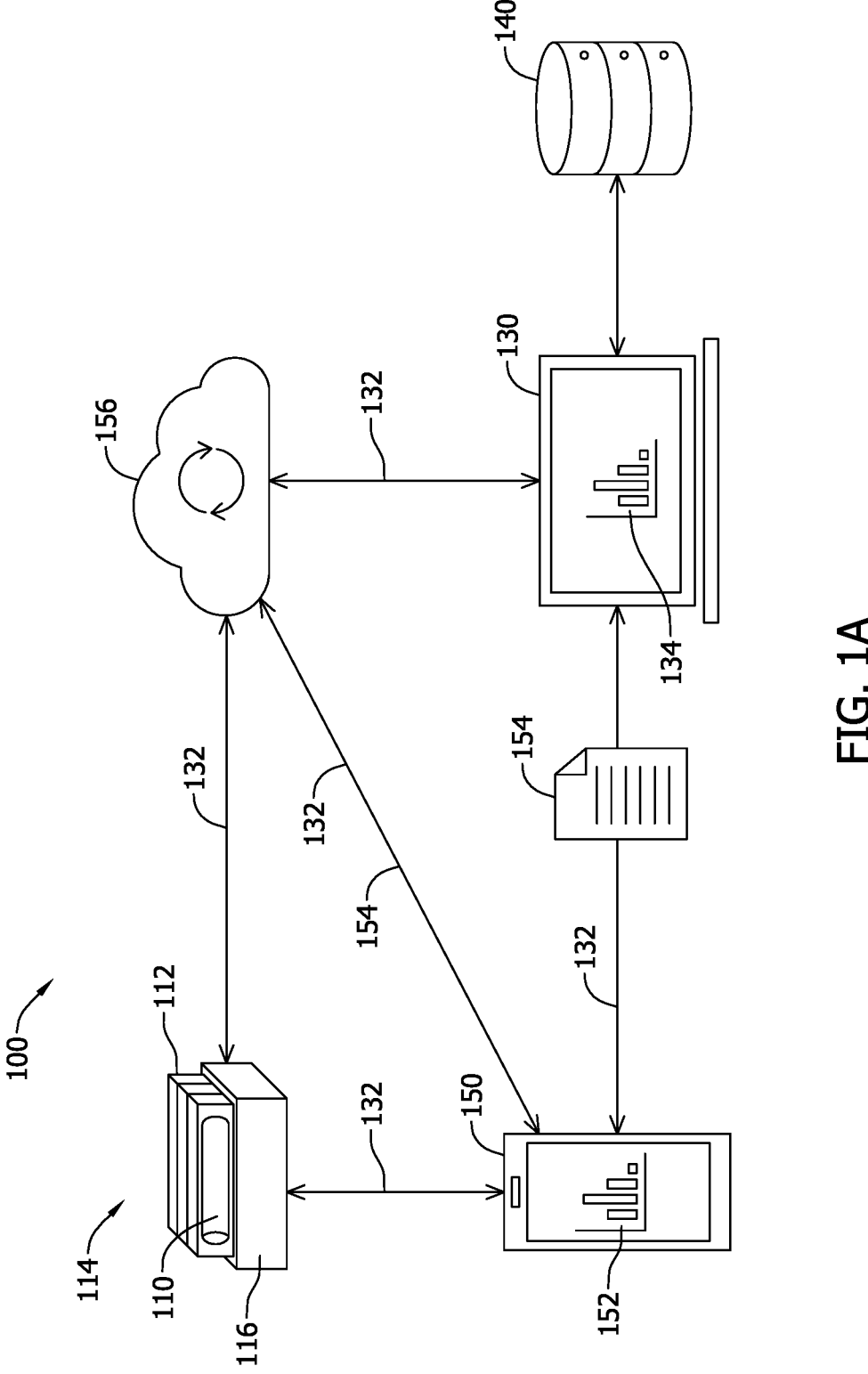
FIG. 1A is a schematic diagram of an exemplary fuse monitoring system.

As system voltages continue to increase in various industrial sectors such as renewable energy, data centers, and in the mining industry to name a few, practical challenges are presented to circuit protection manufactures, generally and to overcurrent protection fuse manufacturers specifically. Among the challenges presented is an increased desired in the market to provide fuses and fuse assemblies with increased performance capabilities while maintaining or reducing existing form factor (such as size, for example) of fuse and fuse assemblies.

Generally speaking, more complex electrical components with monitoring systems tend to have higher associated material costs, higher finished component costs, occupy an undue amount of space, and introduce greater mass. Known high voltage circuit protection fuses incorporating aspects of performance and service life monitoring are, however, relatively complex, expensive, and relatively large. Historically, and for good reason, conventional circuit protection fuses have also tended to increase in complexity, cost, and size to meet the demands of high voltage power systems as opposed to lower voltage systems. As such, existing fuses needed to protect high voltage power systems tend to be much larger than the existing fuses needed to protect the lower voltage power systems of conventional, internal combustion engine-powered vehicles. Smaller or more compact high voltage power fuses incorporating performance and service life monitoring features are desired to meet the needs of manufacturers, without sacrificing circuit protection performance and reliability.

While power systems incorporating fuse monitoring features are known, they are disadvantaged in some aspects desirable for some industries where upgrading an entire electric grid system, including a multitude of fuses and fuse boxes is infeasible, e.g., due to the high up-front costs of replacing fuse blocks with upgraded technology that is capable of monitoring fuse parameters. In particular, known monitoring assemblies that account for environmental conditions of the fuse in addition to operational parameters to determine fuse service life and/or assess fuse performance are too large, too complicated, or prohibitively expensive to meet the needs of industrial power systems. Accordingly, with the goal of retrofitting preexisting fuses and fuse blocks in order to upgrade electrical systems by providing an easily attachable (e.g., quickly, e.g., under 10 min, and without the use of tools), compact, affordable, and reliable fuse monitoring systems and methods to detect and evaluate a plurality of real-time parameters that collectively contribute to fuse fatigue to assess fuse performance.

Furthermore, regarding electric vehicle (EV) applications, providing less expensive fuse monitoring systems that are configured to handle high current and high battery voltages in state-of-the-art EV power systems, while still providing acceptable interruption performance as the fuse element operates at high voltages and monitoring of at least the fuse element continues to be challenging. Fuse manufacturers and EV manufactures would benefit from less expensive and less complex fuse monitoring systems. While EV innovations are leading the markets desired for smaller, more affordable higher voltage fuses and monitoring systems, the trend toward smaller, yet more powerful, electrical systems transcend the EV market. A variety of other power system applications would undoubtedly benefit from less complex and more affordable fuse monitoring systems. The demands imposed on electrical fuses by EV power system applications, however, presents particular challenges that may shorten a service life of the electrical fuses and that may result in unplanned downtime of the vehicle without additional monitoring systems to facilitate prediction of these failure events. Improvements are needed to resolve long-standing and unfulfilled needs in the art.

At least some known fuse blocks have been made available which have the capability of monitoring one or more parameters associated with the performance of the fuse. For example, at least some known smart fuse blocks measure, in real-time, current, voltage, and/or temperature of the fuse. These known smart fuse blocks enable operators to monitor and assess the performance of the fuses so that an operator may replace fuses prior to failure and/or perform intervention operations. In some applications, particularly in electrical systems of industrial or large buildings, there may be a multitude of pre-existing fuses and fuse blocks currently in use that do not have functionality that enables monitoring and/or assessment of the fuses. However, upgrading the multitude of fuses and fuse boxes to smart systems with the capability of monitoring fuse parameters, may be time consuming, costly, and wasteful.

Inventive systems and methods are disclosed below wherein fuse monitoring is achieved at least in part by monitoring parameters such as environmental conditions/data/parameters and/or electrical performance parameters/operational parameters or data, and collectively evaluating the parameters for a similar fuse element to assess an operative state of the fuse, a performance of the fuse, and/or a remaining service life of the fuse. The environmental conditions or parameters may include ambient temperature, humidity, and/or pressure to which the fuse is exposed. The environmental conditions may also include vibration, acceleration, and/or shock to which the fuse is exposed. As used herein, "shock" may refer to impact force, as well as sudden change in acceleration or velocity. The electrical performance parameters include voltage, current, resistance, and/or temperature of the fuse attributable to current loads.

Described below are exemplary systems and methods that facilitate a cost-effective performance monitoring of an electrical fuse element. Monitoring of the performance of the fuse enables an operator to replace a fatigued fuse prior to failure and/or manage inventory of new fuse elements. Monitoring the electric fuse includes measuring real-time parameters associated with the fuse (e.g., temperature, humidity, vibrations, shock, current, and voltage). Monitoring the performance of the fuse may include comparing the measured real-time parameters with one or more threshold values. In some embodiments, the system may provide alerts and notifications concerning the measured parameters and/or the performance of the fuse to a user or an operator associated with the fuse. For example, the system communicates the measured parameters and/or the fuse performance to one or more remote computing devices. Method aspects will be in part apparent and in part explicitly discussed in the following description.

In some embodiments, the systems and methods described herein may be used to determine if the fuse is functioning or if the fuse has failed. If the fuse has failed, the systems and methods may be used to determine one or more reasons, or causes, that contributed to, or caused the failure of the fuse. For example, fuse failure may have been caused by short-circuiting, overloading, and/or the fuse has faulted. In other examples, the fuse may have failed because the fuse was exposed to conditions, e.g., environmental conditions, that are not suitable for the ratings of the fuse. In yet another example, the fuse may have failed because an incorrect fuse was installed.

In some embodiments, the systems and methods described herein may be used to determine one or more recommendations. The recommendations may include maintence operations, intervention procedures, and/or inventory analysis. Maintenance operations may include replacement of failed fuses or replacement of fuses prior to failure. Intervention procedures may include adjusting the conditions to which the fuse is exposed. For example, it may be recommended to cool an area near the fuse, or alternatively, turn off one or more electrical components in electrical connection with the fuse. Regarding EV applications it may be recommended to turn off the EV until safer fuse conditions can be obtained in order to avoid sudden fuse failure. Inventory management may include confirming that fuses are in stock, to be ready to replace one or more fuses that are predicted to fail in the near future. In addition, inventory management may include ordering one or more new fuses and/or shipping fuses from one storage facility to another. The one or more recommendations encompass any suitable recommendations that enables an optimized continued fuse usage while minimal downtime caused by fuse failure.

While the present disclosure describes systems, methods, and apparatus for monitoring fuses used in industrial applications and embodiments of the present disclosure are described in the context of a particular type and rating of a fuse to meet the needs of the exemplary industrial applications, the benefits of the disclosure are not necessarily limited to industrial applications or to the particular type or rating of fuses described. Rather the benefits of the disclosure are believed to accrue more broadly to many different power system applications generating other current profiles. Systems and methods described herein may also be used in electric-powered vehicles such as car boats or planes or non-vehicle power systems. The systems and methods can also be practiced in part or in whole to monitor any type of fuses supported by fuse blocks that are used for any application and in any environment having similar or different ratings than those discussed herein. For example, and without limitation, the fuse monitoring systems and methods described herein may be used to monitor fuses that are used in aerospace applications, automotive applications, and water related vehicles, e.g., submarines, boats, and other types of watercrafts. The fuses and fuse blocks described below are therefore discussed for the sake of illustration rather than limitation.

Fuse Monitoring System

Figure 1B:
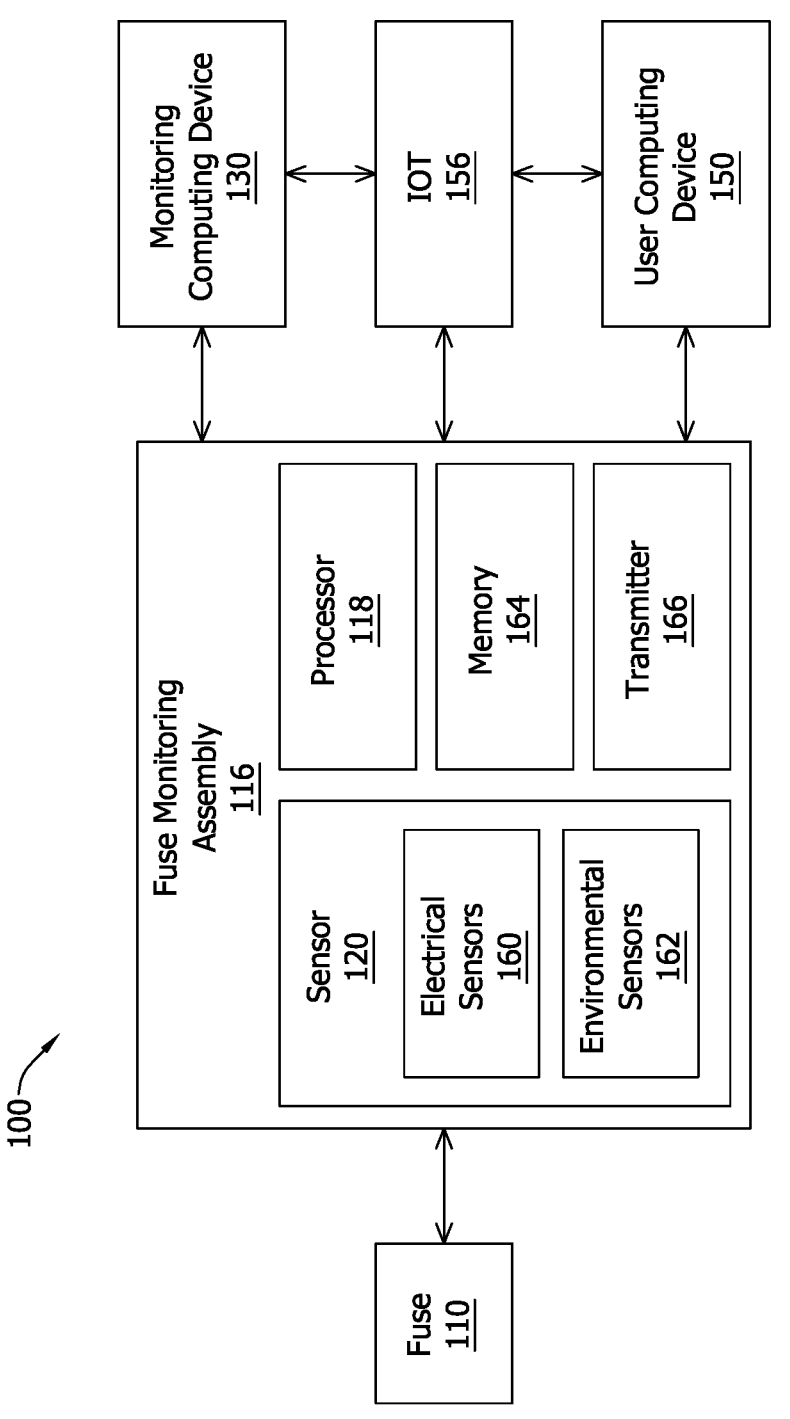
FIG. 1B is a block diagram of the exemplary fuse monitoring system shown in FIG. 1A.

FIG. 1A is a schematic diagram of a fuse monitoring system 100 for monitoring one or more fuses 110 housed within a fuse block 112, according to the exemplary embodiments of the present disclosure. FIG. 1B is a block diagram of the system 100 shown in FIG. 1A. The fuses 110 and the fuse blocks 112 are illustrative only, and do not limit the scope of the system 100 to a particular type of fuse or particular fuse box configuration. As described in further detail herein, the system 100 includes one or more adjustable features that enable the system 100 to be customized to monitor various types of fuses (e.g., cartridge type fuse, D-type fuse, and link-type) used in various applications (e.g., transformers, motors, commercial settings, industrial settings, and computer applications) for various types of fuse blocks 112.

The system 100 includes a fuse monitoring assembly 114 including a fuse monitoring fuse monitoring device 116 selectively connectable to one or more of the fuse blocks 112. The fuse monitoring device 116 includes a processor 118 that is communicatively coupled to one or more sensors 120. The one or more sensors 120 measure one or more parameters associated with the fuse 110. In the exemplary embodiment, the one or more measured parameters, measured by the sensors 120, include environmental conditions (e.g., ambient temperature, humidity, and/or pressure) and/or fuse performance parameters (e.g., fuse temperature, current, voltage, and/or resistance) associated with the fuse 110, as described in further detail herein.

In further reference to FIG. 1B, the system 100 may include a fuse monitoring computing device 130 that is communicatively coupled to the fuse monitoring device 116. In the exemplary embodiment, the sensors 120 collect sensor data 132 related to the one or more measured parameters associated with the fuse 110 and the fuse monitoring device 116 transmits the sensor data 132 to the computing device 130. The computing device 130 analyzes, processes, and/or evaluates the sensor data 132 for the purpose of monitoring the fuse 110. The computing device 130 may include a user interface 134 for displaying sensor data 132 and/or analyzed sensor data 132. The user interface 134 may include a graphical interface with interactive functionality, such that a user or an operator may interactively request information from the system 100. In some embodiments, the computing device 130 is connected to the fuse monitoring device 116, e.g., the processor 118, via a USB connection. For example, the processor 118 may evaluate the sensor data to create one or more outputs to be displayed on the computing device 130, e.g., via the user interface 134. The computing device 130 may be connected to the processor 118 and/or the sensors 120 using any suitable connection. In some embodiments, the user computing device 150 may be connected to the processor 118 and/or the sensors 120 using the USB connection.

In the exemplary embodiment, the computing device 130 evaluates the sensor data 132 using modeling techniques. In some embodiments, the computing device 130 compares the sensor data 132 to one or more corresponding predetermined threshold values to evaluate the performance of the fuse 110. In some embodiments, the computing device 130 may determine, based at least in part on the sensor data 132, one or more fuse metrics. The fuse metrics may include an average of the sensor data 132 over a period of time and/or a rate of change of the sensor data 132 over a period of time. In some embodiments, the computing device 130 filters and/or normalizes the sensor data 132. The computing device 130 may evaluate the sensor data 132 using any suitable methodology or technique that enables the system 100 to function as described herein.

The computing device 130 may also store the sensor data 132 and/or one or more determined metrics associated with the fuse 110 within a fuse database 140. In some embodiments, the fuse monitoring device 116 is also communicatively coupled to the fuse database 140 such that the fuse monitoring device 116 may transmit the sensor data 132 to be stored within the fuse database 140.

In the exemplary embodiment, the system 100 further includes a user computing device 150 that is communicatively coupled to the computing device 130. The user computing device 150 may include a mobile cellular device, a laptop computer, a desktop computer, a tablet computer, and the like. The user computing device 150 includes a user interface 152. The user interface 152 may include a graphical interface with interactive functionality, such that a user or an operator may interactively request information from the system 100. In some embodiments, the user computing device 150 is also communicatively coupled to the fuse monitoring device 116. The user computing device 150 is associated with a computing device that is accessible to a user (e.g., a worker within an industrial environment, and/or any persons associated with the monitoring of the fuse 110) enabling the user to monitor the fuse 110 in real-time. Specifically, the computing device 130 transmits a plurality of messages 154 to the user computing device 150. The messages 154 include information related to the fuse 110. The messages 154 may also include the sensor data 132 such as the measured fuse performance parameters or the measured environmental conditions. The message 154 may include a maintenance recommendation. The computing device 130 transmits any data and/or information that enables system 100 to function as described herein. In the exemplary embodiment, the user computing device 150 may display at least a portion of the contents of the messages 154 using the user interface 152.

In the exemplary embodiment, the computing device 130 transmits the messages 154 to the user computing device 150 as frequently as necessary to enable the system 100 to function as described herein. For example, the computing device 130 transmits messages 154 with sufficient frequency to ensure the user computing device 150 is kept up to date with the real-time status of the fuse(s) being monitored (e.g., performance and/or remaining service life of the fuse(s) 110). The computing device 130 may transmit messages 154 periodically at scheduled time intervals. The computing device 130 may also transmit the messages 154 in response to the computing device 130 processing, evaluating, and/or analyzing the sensor data 132.

In the exemplary embodiment, the fuse monitoring device 116, the computing device 130, and the user computing device 150 are connected as an Internet of Things (IoT) 156, where the fuse monitoring device 116 includes the sensors 120 and the processor 118 and communicates with the computing device 130 and/or the user computing device 150 through Internet or other communication networks formed by wired or wireless communication. The fuse monitoring device 116 may include a unique identifier such as an IP address. As a result, the fuse monitoring device 116 may be identified among a multitude of devices 116 in a large panel board assembly. The fuse monitoring device 116, the computing device 130, and the user computing device 150 may communicate with any other device that is also connected to the IoT 156. The one or more sensors 120 may also be wirelessly communicatively coupled to the processor 118, such that the one or more sensors 120 may transmit sensor data 132 to the processor 118 wirelessly. In other embodiments, the one or more sensors 120 may transmit sensor data 132 to the processor 118 through a wired connection. The computing device 130, the fuse monitoring device 116, and the user computing device 150 may be connected to the IoT 156 through a wired or a wireless connection, supervisory control, and data acquisition (SCADA), or any monitoring or control device. Alternatively, the fuse monitoring fuse monitoring device 116 may communicate with the computing device 130 directly through radio frequency (RF) communication such as short-wave RF communication. Accordingly, data (e.g., sensor data 132 or analyzed/processed sensor data 132) may be wirelessly transmitted from the sensors 120 to the processor 118 or from the fuse monitoring device 116 to the computing device 130. Furthermore, data may be wirelessly transmitted from the computing device 130 to the user computing device 150.

The system 100 configured as IoT 156 is advantageous in saving labor cost and reducing lead time. For example, with the system 100, inspection or maintenance may be reduced because the operation status and life of the fuse monitoring device 116 is available through the computing device 130 and/or the user computing device 150. Further, lead time, the time needed to locate faulty fuses, is reduced because the system 100 provides information of and alerts faulty fuses, and also predicts the end of lives the fuses such that failure of the fuses may be soon expected.

The fuse monitoring device 116, the computing device 130, and the user computer device 150 are separate but are communicatively connected enabling the fuse monitoring device 116, the computing device 130, and the user computing device 150 to exchange information. However, it should be understood that the computing device 130, the user computing device 150, and the fuse monitoring device 116 may be integrated into a single computing device with all the functionality of each of the computing device 130, the user computing device 150, and the fuse monitoring device 116, separately, without deviating from substantially from the present disclosure.

In the exemplary embodiment, at least one of the fuse monitoring devices 116, the computing device 130, and at least one of the sensors 120 communicates with a mobile tower, a cell tower, or a base transceiver station (BTS). The BTS includes antennas and electronic communication equipment and create a cell in a cellular network or a telecommunications network, which is used for transmission of voice, data, and other types of content. The BTS may be in a telecommunications network such as 3G, 4G, or 5G networks.

In some embodiments, the computing device 130 includes a processor-based microcontroller including a processor and a memory device wherein executable instructions, commands, and control algorithms, as well as other data and information needed to satisfactorily operate the fuse monitoring system 100, are stored. The memory device may be, for example, a random-access memory (RAM), and other forms of memory used in conjunction with RAM memory, including but not limited to flash memory (FLASH), programmable read only memory (PROM), and electronically erasable programmable read only memory (EEPROM).

As used herein, the term "processor-based" microcontroller shall refer not only to controller devices including a processor or microprocessor as shown, but also to other equivalent elements such as microcomputers, programmable logic controllers, reduced instruction set circuits (RISC), application specific integrated circuits and other programmable circuits, logic circuits, equivalents thereof, and any other circuit or processor capable of executing the functions described below. The processor-based devices listed above are exemplary only, and are thus not intended to limit in any way the definition and/or meaning of the term "processor-based."

In further reference to FIG. 1B, the fuse monitoring device 116 includes any number of sensors 120 enabling the system 100 to function as described herein. In the exemplary embodiment, the one or more sensors 120 includes electrical sensors 160 that are configured to measure fuse performance parameters associated with the fuse and environmental sensors 162 configured to measure the environmental conditions of the environment in which the fuse block 112 and fuse 110 locates, e.g., ambient temperature, ambient humidity, ambient pressure, vibrations, and shock. The fuse temperature and the environmental temperatures may be correlated but are two separate measurements. The environmental, also referred to as ambient, temperature is the temperature to which the fuse 110 is exposed, while the fuse temperature is the operating temperature of the fuse 110, itself, which may be heated by both the environmental temperature and joule heating attributable to current flowing through the fuse 110.

As described above, the processor 118, of the fuse monitoring device 116, is communicatively coupled to each of the one or more sensors 120. In some embodiments, the fuse monitoring device 116 may include a memory 164 that is communicatively coupled to the processor 118 and/or the one or more sensors 120. The processor 118 may collect the sensor data 132 and store the sensor data 132 within the memory 164, prior to transmitting the sensor data 132 to the computing device 130. In the exemplary embodiment, the fuse monitoring device 116 may include a transmitter 166 that the processor 118 uses to transmit the sensor data 132, in-real time, to the computing device 130. The sensor data 132 may be periodically or continuously transmitted to the computing device 130. The processor 118 may transmit the sensor data 132 at a rate that is approximately equal to a sampling rate of the one or more sensors 120. For example, the ambient temperature sensor may sample ambient temperature every second, for example, and accordingly, the processor 118 transmits the sensor data 132 to the computing device 130 every second. In some embodiments, the processor 118 may store the sensor data 132 within the memory 164 and then periodically, at scheduled time increments, transmit the sensor data 132 to the computing device 130 in batches.

In some embodiments, the processor 118 may compare the sensor data 132 to one or more corresponding predetermined thresholds. When the processor 118 determines that the sensor data 132 has exceeded the predetermined threshold, the processor 118 may initiate transmission of the sensor data 132, and/or a warning message, to the computing device 130. When the processor 118 determines that one or more thresholds have been crossed, the processor 118 may override a scheduled periodic transmission of the sensor data 132. The processor 118 may transmit the sensor data 132 to the computing device 130 as frequently as necessary to enable the system 100 to function as described herein.

Fuse Model

The computing device 130 generates a fuse model based on one or more training datasets using machine learning techniques. More specifically, the computing device 130 uses a training dataset to train the fuse model, such as to develop a set of rules or conditions that may be applied to real-time sensor data 132, for example, inputs, and generate outputs associated with the fuse. The training dataset may include historical fuse data, or any information needed to train the fuse model.

In the example embodiment, the computing device 130 includes a modeling component. The modeling component includes a computer-executable instruction for using at least a machine learning algorithm. Machine learning algorithms used by the modeling component may include artificial neural network and Bayesian statistics. Other machine learning models used by the modeling component may include, for example, decision tree, inductive logic, learning vector quantization, ordinal classification, and information fuzzy networks (IFN).

As used herein, "machine learning" refers to statistical techniques to give computer system the ability to "learn" (e.g., progressively improve performance on a specific task) with data, without being explicitly programmed for that specific task. "Artificial intelligence" refers to computer-executed techniques that allow a computer to interpret external data, "learn" from that data, and apply that knowledge to a particular end. Artificial intelligence may include, for example, neural networks used for predictive modeling.

The computing device 130 applies one or more inputs into the trained fuse model to determine or more outputs. In the exemplary embodiment, the one or more inputs are fuse data associated with the fuse 110, such as the sensor data 132, collected in real-time, by the plurality of sensors 120. Fuse data include operational data such as current, voltage, resistance, and/or temperature of the fuse 110 and environmental data associated with the fuse 110 such as shock, vibration, ambient temperature, and/or humidity of the environment in which the fuse 110 locates. Inputs may also include other fuse data associated with the fuse 110, such as fuse class, fuse maximum current rating, interrupting rating, current limiting, and a general use of the fuse. Fuse data may also include if the fuse 110 is fast acting or time delayed. In some embodiments, the computing device 130 may calculate inputs, based at least in part on sensor data 132, to be applied to the fuse model. For example, the computing device 130 may calculate an average ambient temperature over a period of time. The computing device 130 may use the average ambient temperature as an input into the fuse model.

The sensor data 132 may be received by the computing device 130, in real-time, e.g., continuously and/or periodically, and the computing device 130 may apply the model to the sensor data 132, continuously (e.g., at a sampling rate of the plurality of sensors 120) and/or periodically, such that the output of the model reflects the real-time state of the fuse 110. For example, the computing device 130 may receive from the processor 118, real-time ambient temperature data, collected by the environmental sensor 162. The computing device 130 may input the real-time ambient temperature data into the model periodically at scheduled time intervals, e.g., every minute, every five minutes, every hour, every three hours, for example, to determine the remaining service life of the fuse 110.

The computing device 130 may apply the inputs to the model to determine one or more outputs. In the exemplary embodiment, the one or more outputs may include a remaining service life of the fuse associated with how long the fuse should be used before the fuse should be replaced or before the fuse will fail. The remaining service life of the fuse may be a remaining service lifetime (e.g., ten hours remaining service life), a number of remaining service life cycles (e.g., the fuse may be used ten more times before replacement is recommended). In some embodiments, the output may include a suggested fuse classification. For example, the computing device 130 may determine, using the fuse model and the inputs, for a fuse having a first classification and used in a specific application, that a different fuse classification may be better suited for the application. In some embodiments, the output may include a determination of whether the fuse 110 is no longer functioning, e.g., the fuse 110 has failed. For example, the output may include a determination that the fuse 110 has short-circuited, overload, and/or has faulted. In other examples, the output may include a determination that the fuse 110 is not suitable for a particular application, e.g., a fuse was incorrectly installed, or a wrong type of fuse was installed.

In some embodiments, a physical model is used to predict life of a fuse based on environmental data and/or operation data. For example, a physical model may include empirical relations between fuse data and life of the fuse derived based on historical data, physical relations, or rules such as Miner's rule based on the cyclic characteristics of the operational data such as current, voltage, and/or resistance. The historical data may be used to fit and optimize the model. In one example, a plurality of thresholds on environmental data and/or operation data may be derived based on historical data and used to predict the life of the fuse. Alternatively, a combination of a physical model and a machine-learning model is used to predict life of a fuse based on the measured data. For example, the prediction may be started with a physical model when training or historical data is lacking or insufficient to train a machine-learning model to achieve a desired confidence level. The real-time data and predicted life may be used to train the machine-learning model. As the confidence level of the machine-learning model increases, the machine-learning model may become the main model in life prediction.

Systems and methods described herein predict the remaining life based on operation data such as resistance, current, voltage, and/or temperature of the fuse, as well as environmental data such as ambient temperature, shock, vibration, and/or humidity of the ambient environment of the fuse. The accuracy of the predicted life is increased because environmental data and operation data both play a role in affecting the fuse's life.

Electrical Fuse Element

Figure 1C:
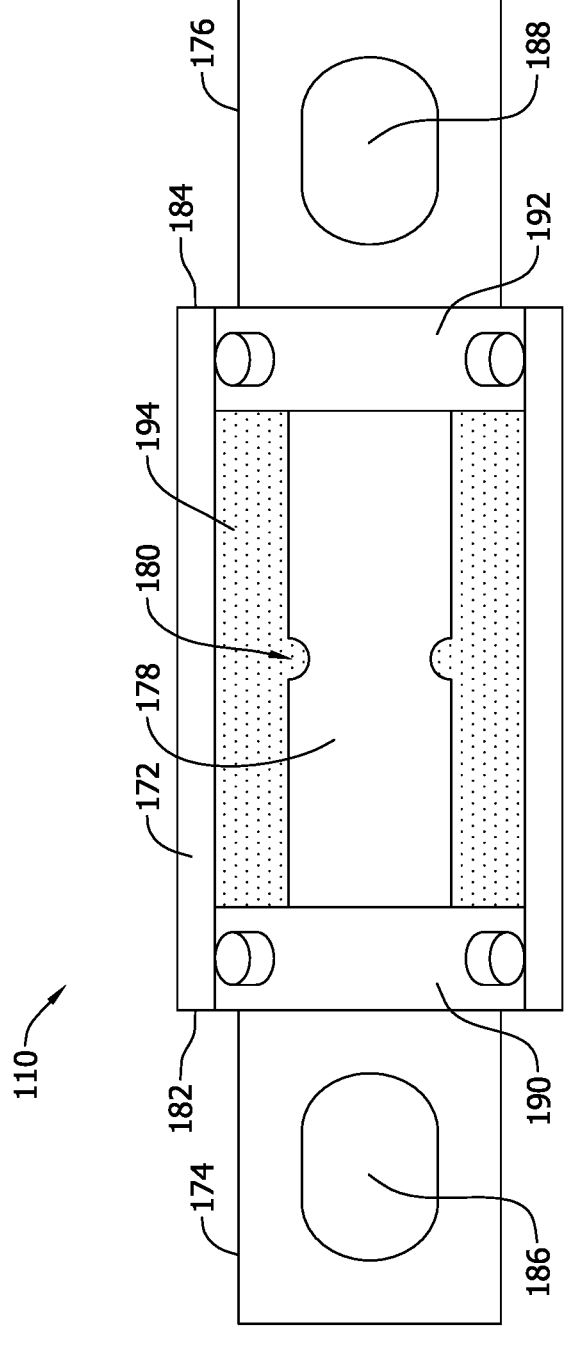
FIG. 1C is a top view of an exemplary fuse for use with monitoring system shown in FIGS. 1A and 1B.

FIG. 1c shows an exemplary fuse 110 for use with system 100 and the monitoring assembly 114. In the exemplary embodiment, the fuse includes a housing 172 and terminal blades 174, 176. The terminal blades 174, 176 may be the same or different from one another. The fuse 110 includes a fuse element 178. The fuse 110 further includes a fuse element week-spot 180 that completes an electrical connection between the terminal blades 174, 176. When subjected to predetermined current conditions, at least a portion of the fuse element 178 melts, disintegrates, or otherwise structurally fails and opens the circuit path between the terminal blades 174, 176. The load side circuitry is therefore electrically isolated from the line side circuitry to protect the load side circuit components and the circuit from damage when electrical fault conditions occur.

The fuse 110 in one example is engineered to provide a predetermined voltage rating and a current rating suitable for use in an electrical power systems. In one example, the housing 172 is fabricated from a non-conductive material known in the art such as glass melamine. Other known materials suitable for the housing 172 could alternatively be used in other embodiments as desired. Additionally, the housing 172 shown is generally cylindrical or tubular and has a generally circular cross-section along an axis parallel to length of the terminal blades 174, 176 in the exemplary embodiment shown. The housing 172 may alternatively be formed in another shape if desired, however, including but not limited to a rectangular shape having four side walls arranged orthogonally to one another, and hence having a square or rectangular-shaped cross section. The housing 172 as shown includes a first end 182, a second end 184, and an internal bore or passageway between the opposing ends 182, 184 that receives and accommodates the fuse element 178. In some embodiments the housing 172 may be fabricated from an electrically conductive material if desired, although this would require insulating gaskets and the like to electrically isolate the terminal blades 174, 176 from the housing 172.

The terminal blades 174, 176 respectively extend in opposite directions from each opposing end 182, 184 of the housing 172 and are arranged to extend in a generally co-planar relationship with one another. Each of the terminal blades 174, 176 may be fabricated from an electrically conductive material such as copper or silver or suitable metal alloys in contemplated embodiments. Other known conductive materials may alternatively be used in other embodiments as desired to form the terminal blades 174, 176. Each of the terminal blades 174, 176 is formed with an aperture 186, 188 that may receive a fastener such as a bolt (not shown) to secure the fuse 110 in place in an EV application to establish line and load side circuit connections to circuit conductors via the terminal blades 174, 176.

While terminal blades 174, 176 are shown and described for the fuse 110, other terminal structures and arrangements may likewise be utilized in further and/or alternative embodiments. In various embodiments, the end plates 190, 192 may be formed to include the terminal blades 174, 176 or the terminal blades 174, 176 may be separately provided and attached. The end plates 190, 192 may be considered optional in some embodiments and connection between the fuse element 178 and the terminal blades 174, 176 may be established in another manner.

An arc quenching medium or material 194 surrounds the fuse element 178. In one contemplated embodiment, the arc quenching medium 194 includes quartz silica sand and a sodium silicate binder. The arc quenching medium 194 creates a thermal conduction bond of sodium silicate to the fuse element 178, the quartz sand, the housing 172 and the end plates 190 and 192. This thermal bond allows for higher heat conduction from the fuse element 178 to its surroundings, circuit interfaces and conductors.

In contemplated embodiments, the fuse 110 may include a short circuit element and/or an overload fuse element that is calibrated to melt, disintegrate, or otherwise structurally fail to conduct current in response to specified overcurrent conditions. The structural failure of the fusible element creates an open circuit between the fuse terminal elements but otherwise withstands other electrical current conditions. This operation of the fusible element from an intact, current carrying state to a non-current carrying state or open state, desirably electrically isolates load-side circuitry connected through the fuse 110 and protects the load-side circuit from damage that may otherwise result from overcurrent conditions. Once the fuse 110 operates to open or interrupt the circuit between the line and load-side terminals 228, 230 it must be replaced to restore the connection between the line and load-side terminal 228, 230 and the associated line and load side circuitry.

As mentioned above, the fuse 110 and the fuse blocks 112, described in detail below, are examples, which do not limit the scope of the system 100 and/or the fuse monitoring device 116. The fuse monitoring device 116 is customizable and modular such that the fuse monitoring device 116 is configured to monitor various types of fuses used in various applications without changing the design of the fuse monitoring device 116. As will be described in detail herein, the fuse monitoring device 116 includes attachment mechanisms that allow a user to easily, e.g., quickly (e.g., under 5 minutes) and without the use of tools, attach the fuse monitoring device 116 to preexisting fuse blocks 112 and operably connect the fuse monitoring device 116 to the one or more fuses 110 already supported by the fuse blocks 112. Because the fuse monitoring device 116 is modular, to accommodate a large panel board assembly, additional devices 116 may be included as modules to expand the monitoring functionality of the devices 116. The modular configuration of the fuse monitoring device 116 is advantageous in upgrading existing systems without redesign of the fuse monitoring device 116 or the existing systems, thereby reducing cost in assembling and labor.

Figure 2:
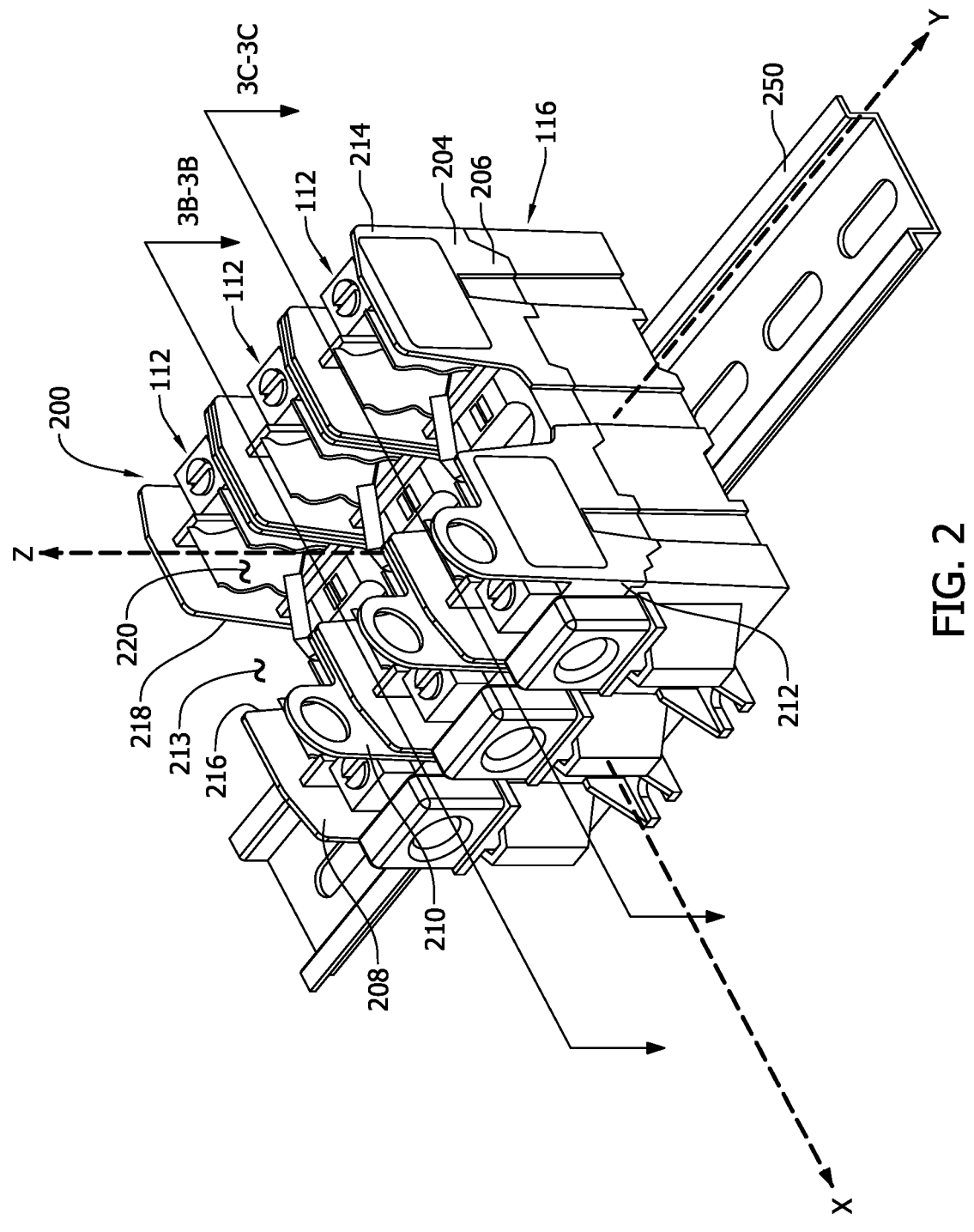
FIG. 2 is a perspective view of an exemplary fuse monitoring assembly for use with the fuse monitoring system shown in FIGS. 1A and 1B, wherein the fuse monitoring assembly includes a monitoring device connected to a fuse block.
Figure 3A:
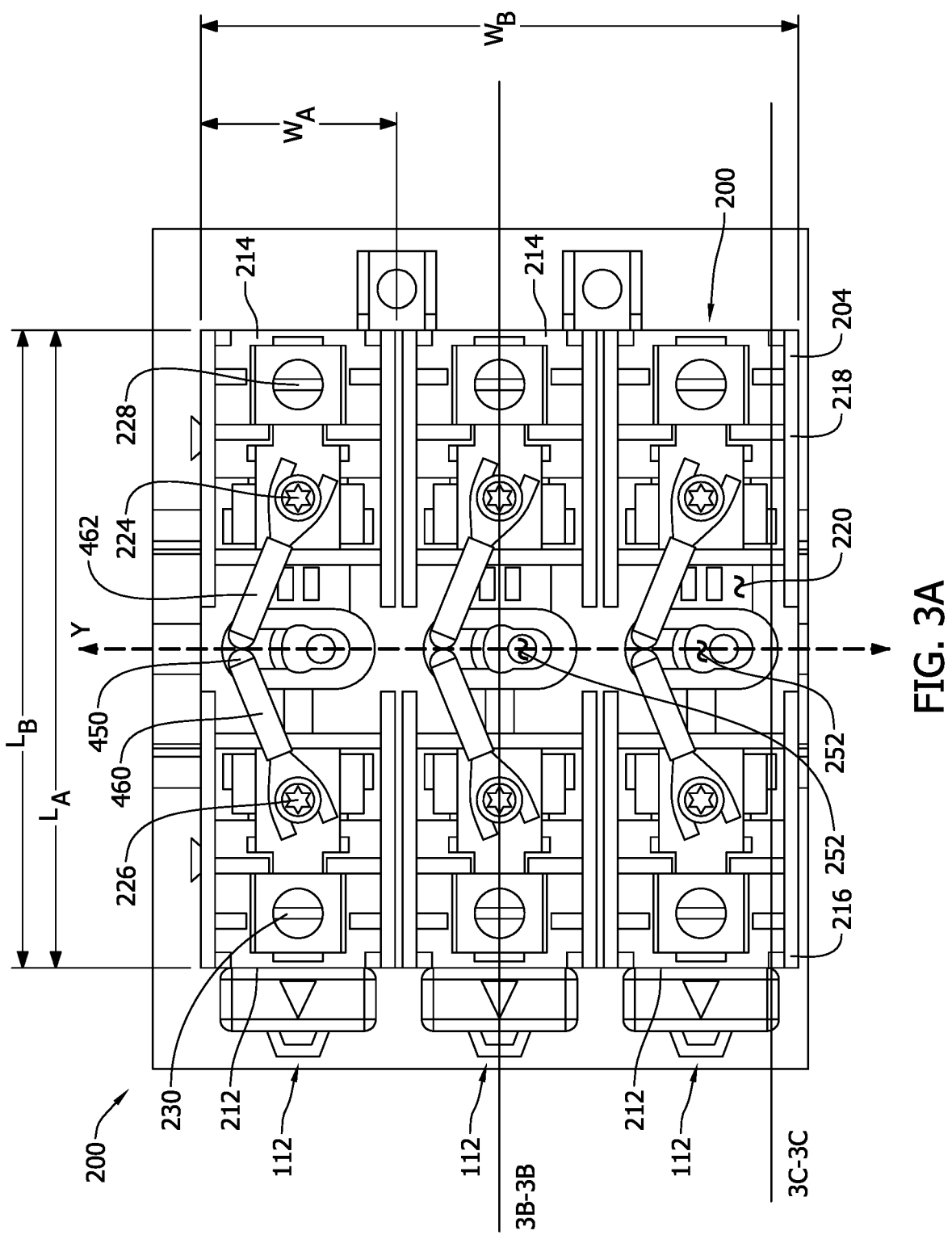
FIG. 3A is a top view of the fuse monitoring assembly, shown in FIG. 2.
Figure 3B:
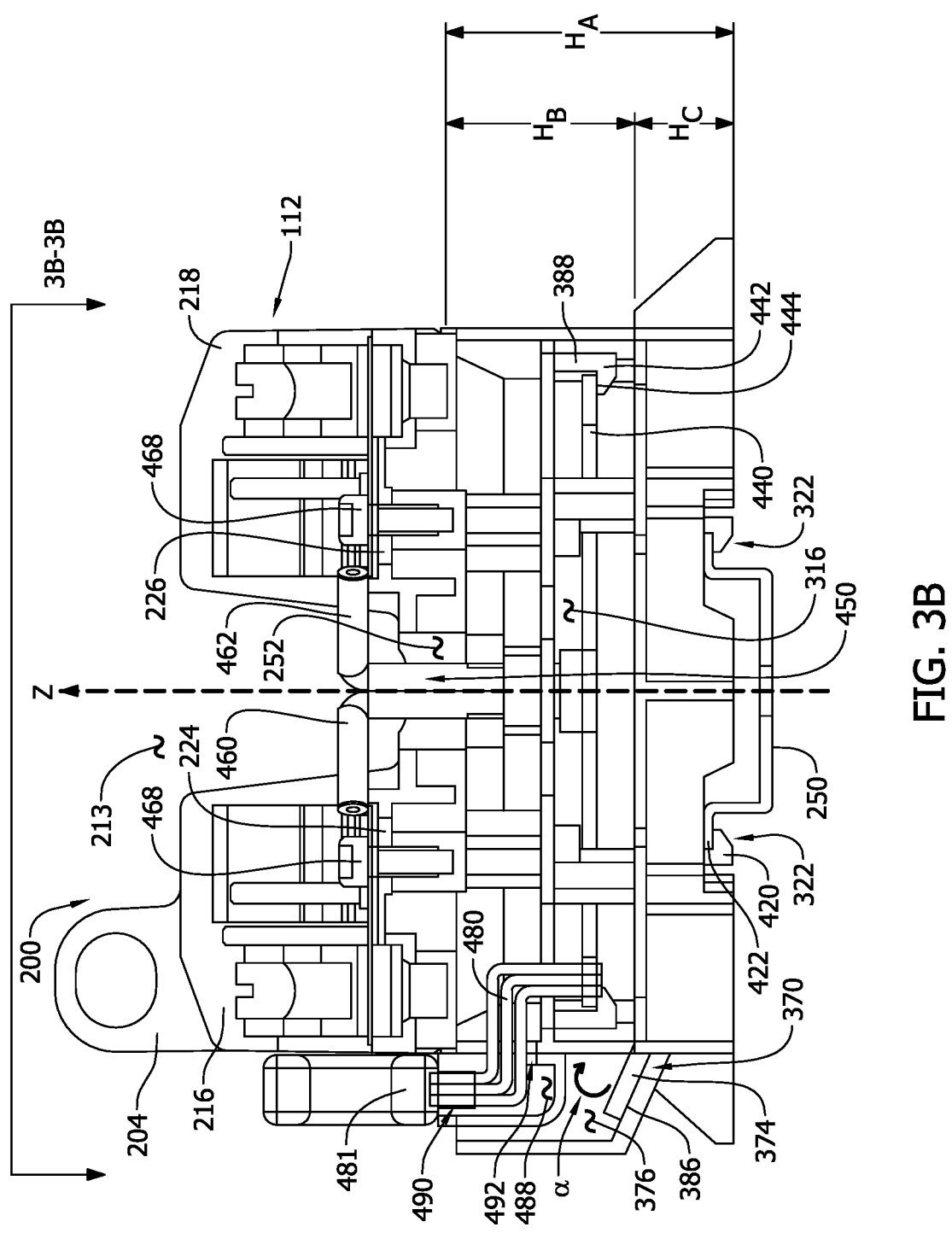
FIG. 3B is a cross-section view of the fuse monitoring assembly along cross-section line 3B-3B, shown in FIG. 3A.
Figure 3C:
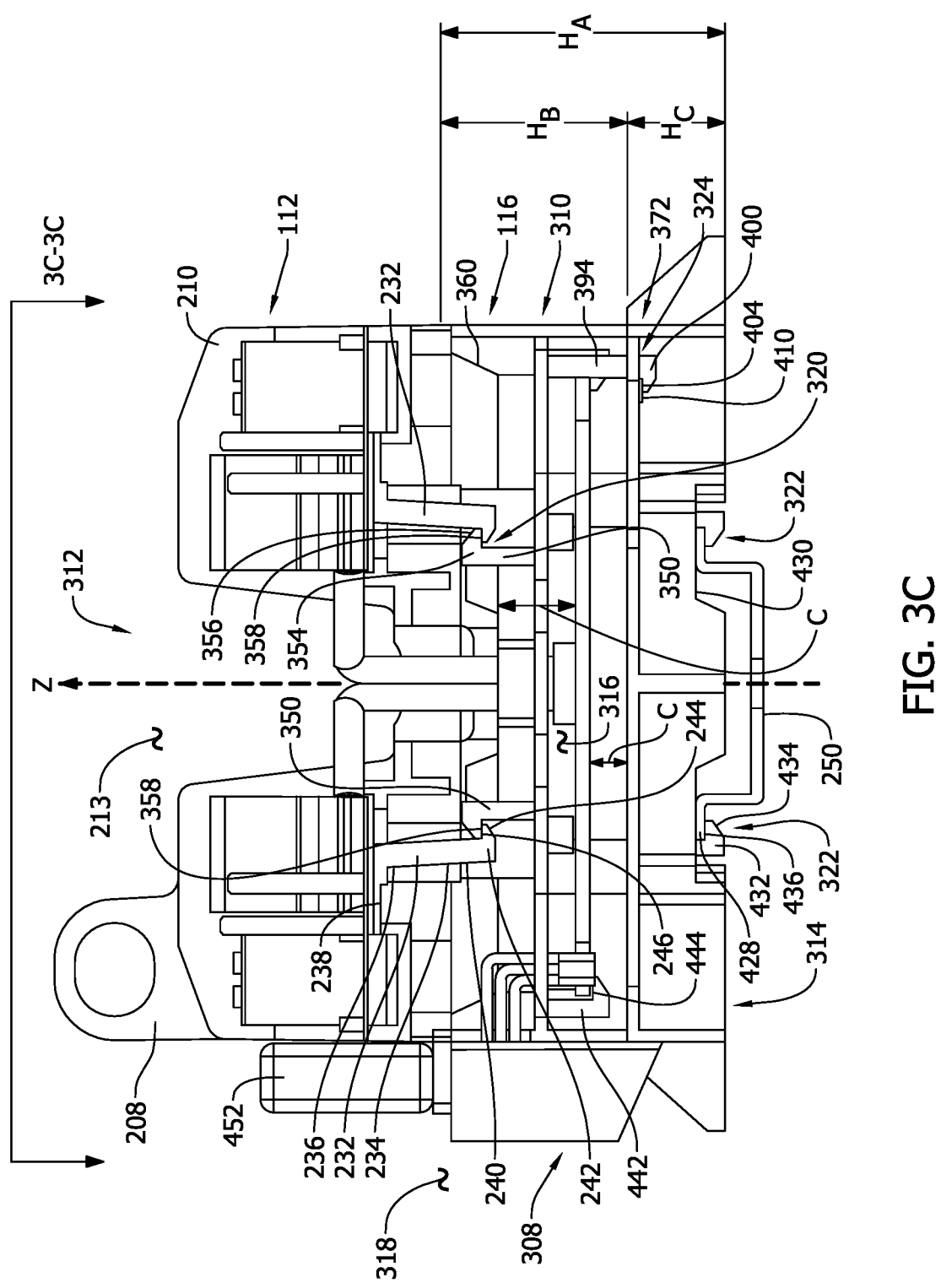
FIG. 3C is a cross-section view of the fuse monitoring assembly along cross-section line 3C-3C, shown in FIG. 3A.
Figure 4:
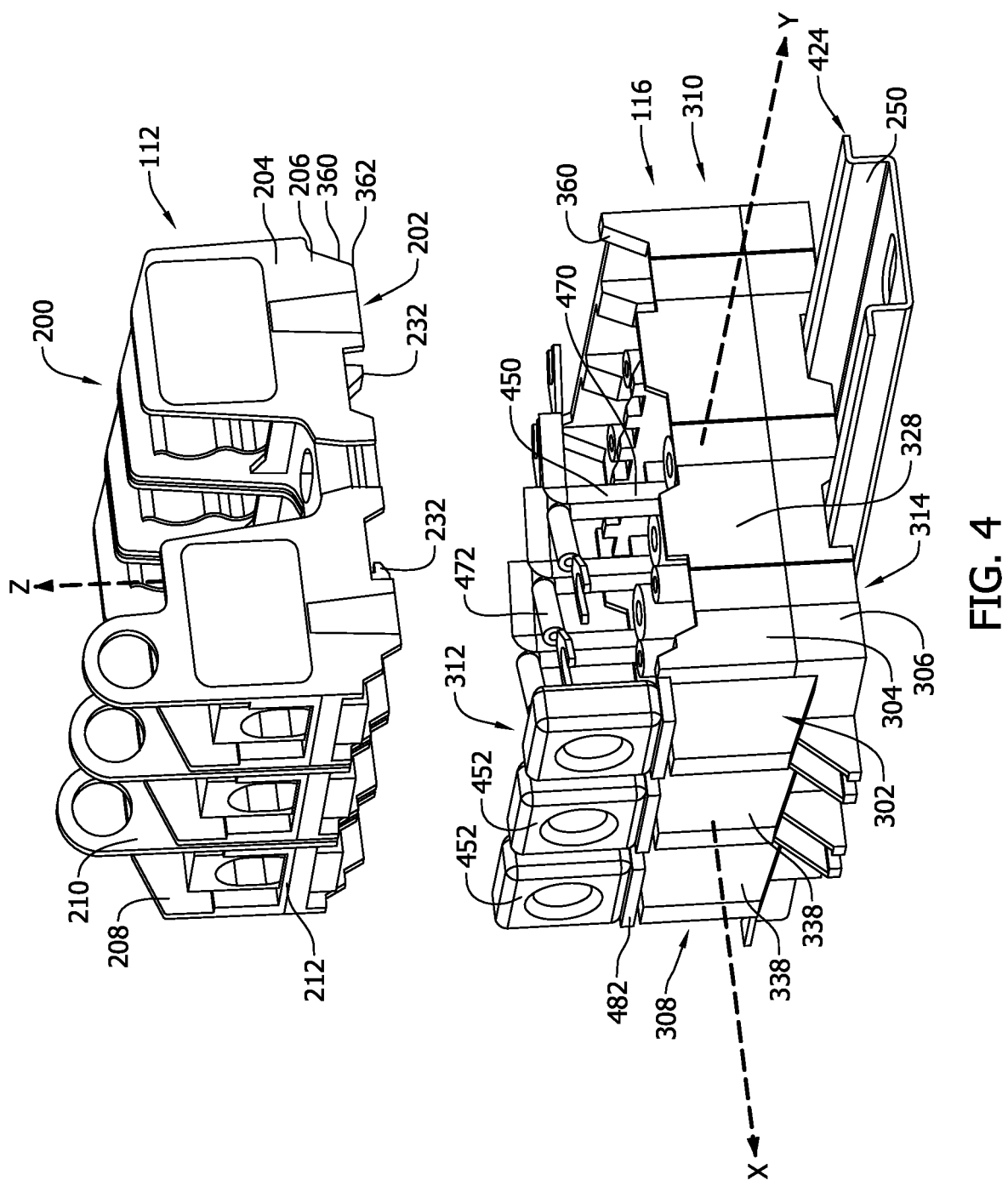
FIG. 4 is an exploded view of the fuse monitoring assembly showing the monitoring device disconnected from the fuse blocks.

FIGS. 2-4 show an exemplary fuse monitoring assembly 114 including the fuse monitoring fuse monitoring device 116 connected to a plurality of fuse blocks 112. FIGS. 2-3 shows the fuse monitoring device 116 connected to fuse blocks 112 and operably connected to one or more fuses 110 (not shown) that are monitored by the fuse monitoring device 116. While three fuse blocks 112 are shown to connect to the monitoring fuse monitoring device 116, the system 100, and in particular, the monitoring fuse monitoring device 116, is scalable to any number of fuse blocks 112 that is desirable. In other embodiments, the fuse monitoring fuse monitoring device 116 may be configured to monitor any number of fuses 110, including a single fuse (such as one and only one fuse, for example) as desired. In other example embodiments, the monitoring fuse monitoring device 116 may be configured to monitor a plurality of fuses 110 supported by 5 fuse blocks 112 for example.

Fuse Block

The illustrated fuse blocks 112 are shown as an example for illustrative purposes only. The fuse block 112 may be a pre-existing fuse block 112. The fuse monitoring device 116 may be retrofit onto pre-existing fuse blocks 112, without any changes to the fuse blocks 112. The fuse monitoring device 116 is modular allowing reduction of costs and simplification of maintenance and updates. For example, if one or more fuses 110 supported by one or more fuse blocks 112 has already been installed on site, fuse monitoring device 116 is modular and configured to monitor the fuse 110 without the need to replace the fuse 110 and/or the fuse blocks 112. The fuse monitoring device 116 may include sensors 120 that are rated to measure a range of current, voltage, and/or resistance that the fuse 110 is likely to experience. Furthermore, different applications the fuse 110 may be exposed to different conditions, and therefore the fuse monitoring device 116 is customizable such that the fuse monitoring device 116 may be configured to monitor a specific type of fuse having a specific fuse classification and/or a specific fuse application. In the illustrated embodiment, the fuse monitoring device 116 is customized to monitor one or more of fuses 110 supported by fuse blocks 112 in an industrial application. In an alternative embodiment, the fuse monitoring device 116 may be customized to monitor one or more fuses used in an electric vehicle application. The fuse monitoring device 116 may also be customized to monitor a specific classification of fuse.

In reference to FIG. 4, the fuse blocks 112 include a first side 200 and a second side 202 that connects the fuse block 112 to the fuse monitoring device 116. The fuse block 112 includes an electrically nonconductive housing 204 formed with a base wall 206 and upstanding side walls 208, 210 extending from opposed longitudinal end edges 212, 214 of the base wall 206. The side walls 208, 210 extend generally parallel to one another and include a centrally located cutout portion 213 and barrier portions 216, 218 extending on each side thereof to end of respective end edges 212, 214 of the base wall 206. The side walls 208, 210 in combination with the base wall 206 define a fuse receptacle 220 extending above the base wall 206 and between the side walls 208, 210. The fuse receptacle 220 is generally elongated and is open and accessible from the top as shown in FIG. 3A and also is open and accessible from end edges 212, 214. As such, the fuse block 112 may be recognized as an open style fuse block.

In reference again to FIG. 3A, the base wall 206 is provided with a set of fuse contact terminals in the form of a first fuse contact terminal 224 on one side of the fuse receptacle 220 near the end edge 214 and a second fuse contact terminal 226 on another side of the fuse receptacle 220 near the end edge 212. Line and load side terminals 228, 230 are also provided adjacent the fuse contact terminals 224, 226 and are configured for connection to external line and load-side circuitry. In contemplated embodiments, the fuse contact terminals 224, 226 are configured as resilient fuse clips, and the line and load-side terminals 228, 230 are configured to receive a stripped end of a respective wire and secured in place with a screw clamp arrangement as shown. A variety of alternative terminal structures and configurations are known and may be utilized in further and/or alternative embodiments. In operation, the fuse 110 (see FIG. 1C) may be received in the fuse receptacle 220 between the side walls 208, 210 as shown.

In the exemplary embodiment, the fuse block 112 includes one or more holder attachments 232 extending from the second side 202 (FIGS. 3C and 4). The holder attachments 232 are sized and shaped such that the fuse block 112 may be mounted to any suitable mounting surface. For example, the holder attachments 232 may be used to attach the fuse block 112 to a mounting structure 250. Alternatively, in the illustrated embodiment, the fuse blocks 112 may be used to attach the fuse blocks 112 to the fuse monitoring device 116. The holder attachments 232 includes a beam 234 having a proximal end 236 connected to and extending from a lower surface 238 of the fuse block 112 and a distal end 240. The holder attachments 232 includes a head 242 disposed at the distal end 240 of the beam 234. The head 242 includes a sliding surface 244 and an engagement surface 246. The fuse blocks 112 further include a fuse channel 252 defined in the base wall 206. The fuse channel 252 may be arranged generally in a middle of the base wall 206, e.g., halfway between the line and load-side terminal 228, 230. The fuse channel 252 provides a passageway for the sensors 120 to extend outside of the housing cavity 316 to be operably connected to the fuse 110.

Fuse Monitoring Assembly

In reference to FIGS. 4-8, the fuse monitoring fuse monitoring device 116 includes a housing 302 having a first housing 304 and a second housing 306. The system 100 includes a holder attachment mechanism 320, arranged on a first or top side 312 of the first housing 304, that enables one or more fuse blocks 112 to be connected to the fuse monitoring device 116. The system 100 includes a mounting attachment mechanism 322 arranged on a second or bottom side 314 of the second housing 306 that enables the device to be mounted to a mounting structure 250. The fuse monitoring device 116 further includes a housing attachment mechanism 324 that enables the first housing 304 and the second housing 306 to be connected together. Each of the holder attachment mechanism 320, the mounting attachment mechanism 322, and the housing attachment mechanism 324, as will be described in further detail herein, providing an easily attachable mechanism (e.g., quickly, e.g., under 10 min, and without the use of tools) for assembly and retro-fitting operations.

The holder attachment mechanism 320 and the mounting attachment mechanism 322 enables the fuse monitoring device 116 to be retrofitted with one or more preexisting fuse blocks 112. For example, in some applications, one or more pre-existing fuse blocks 112 may already attached to one or more preexisting mounting structures 250 such as a DIN rail, via the holder attachment mechanism 320. During a retro-fitting process, the fuse monitoring device 116 may be retrofit onto the preexisting fuse blocks 112, by first disconnecting the preexisting fuse blocks 112 from the preexisting mounting structure 250. Subsequently, the fuse blocks 112 may be attached to the top side 312 of the fuse monitoring device 116 using the holder attachment mechanism 320 and the bottom side 314 of the fuse monitoring device 116 may be attached to the existing mounting structure 250 using the mounting attachment mechanism 322.

Figure 5:
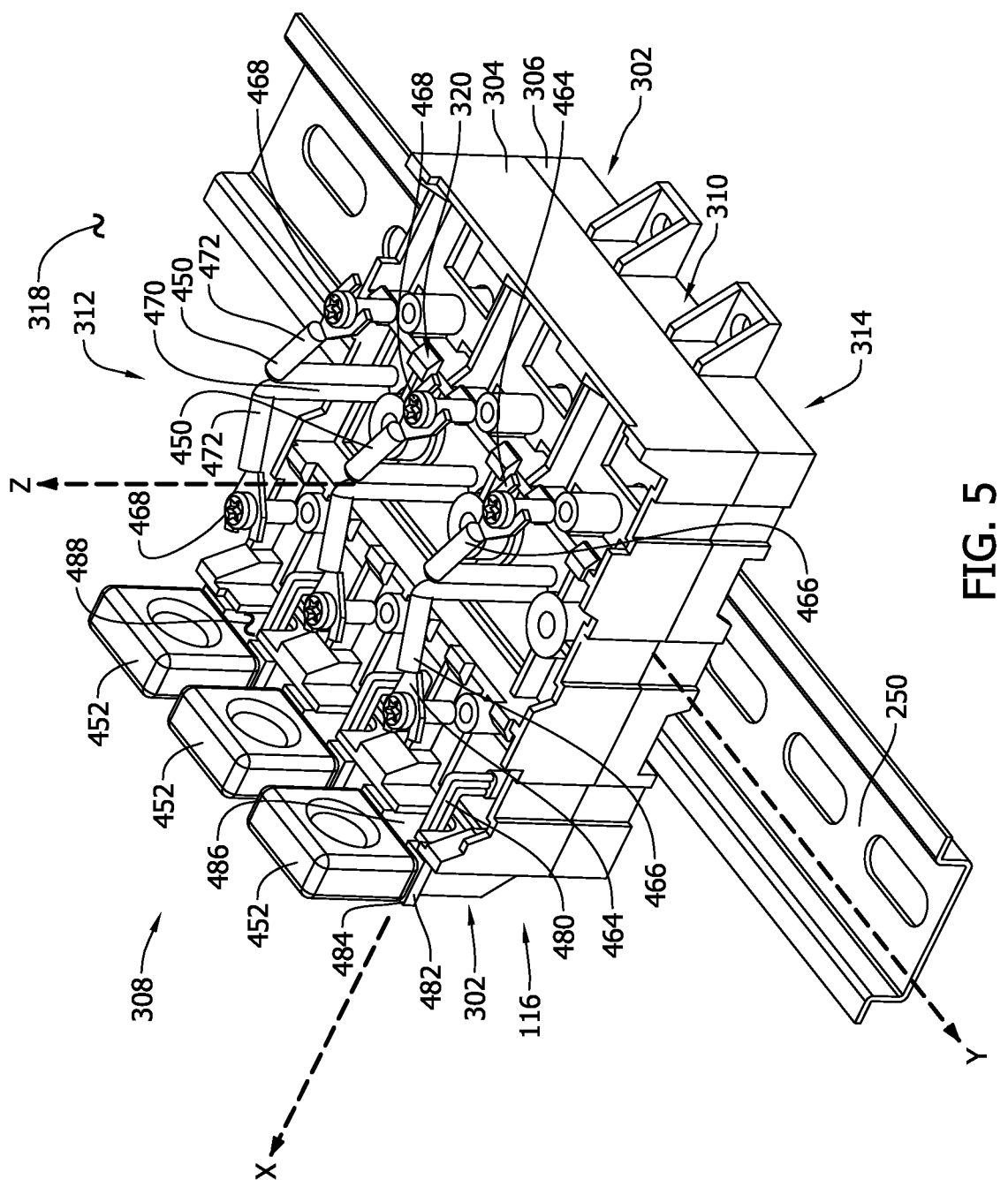
FIG. 5 is a perspective view of the fuse monitoring device.
Figure 6A:
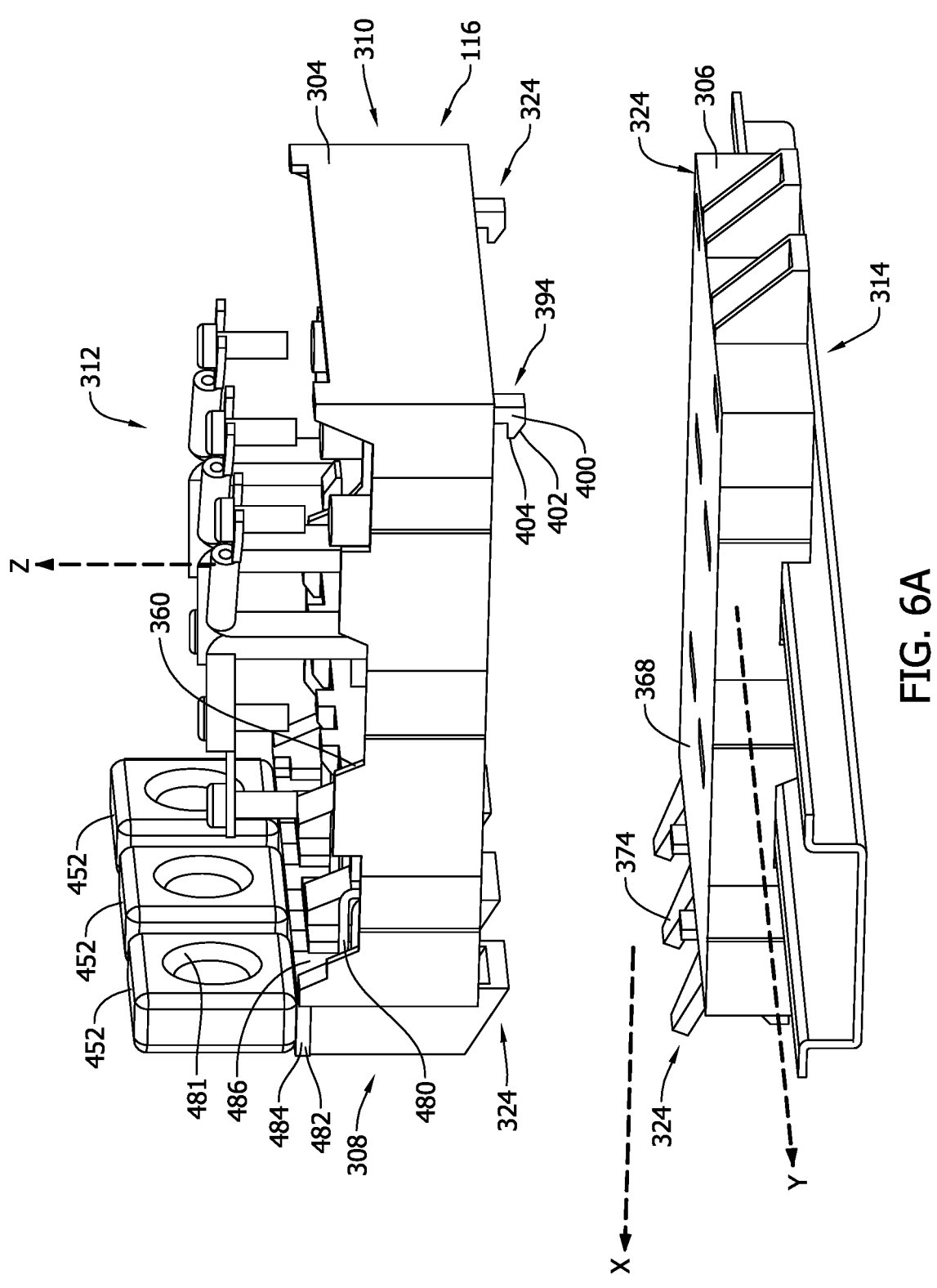
FIG. 6A is an exploded view of the fuse monitoring assembly showing a first housing disconnected from a second housing.
Figure 6B:
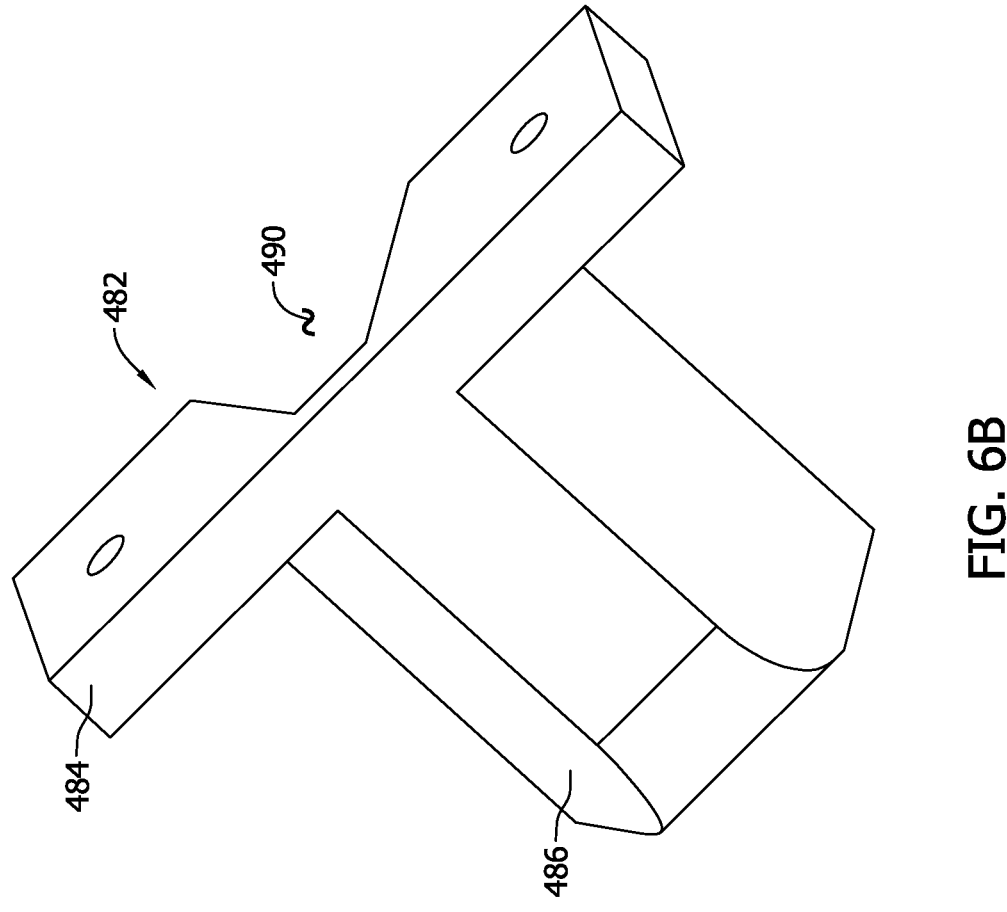
FIG. 6B is a detailed view of a frame for mounting a current sensor for use with the monitoring assembly.
Figure 6C:
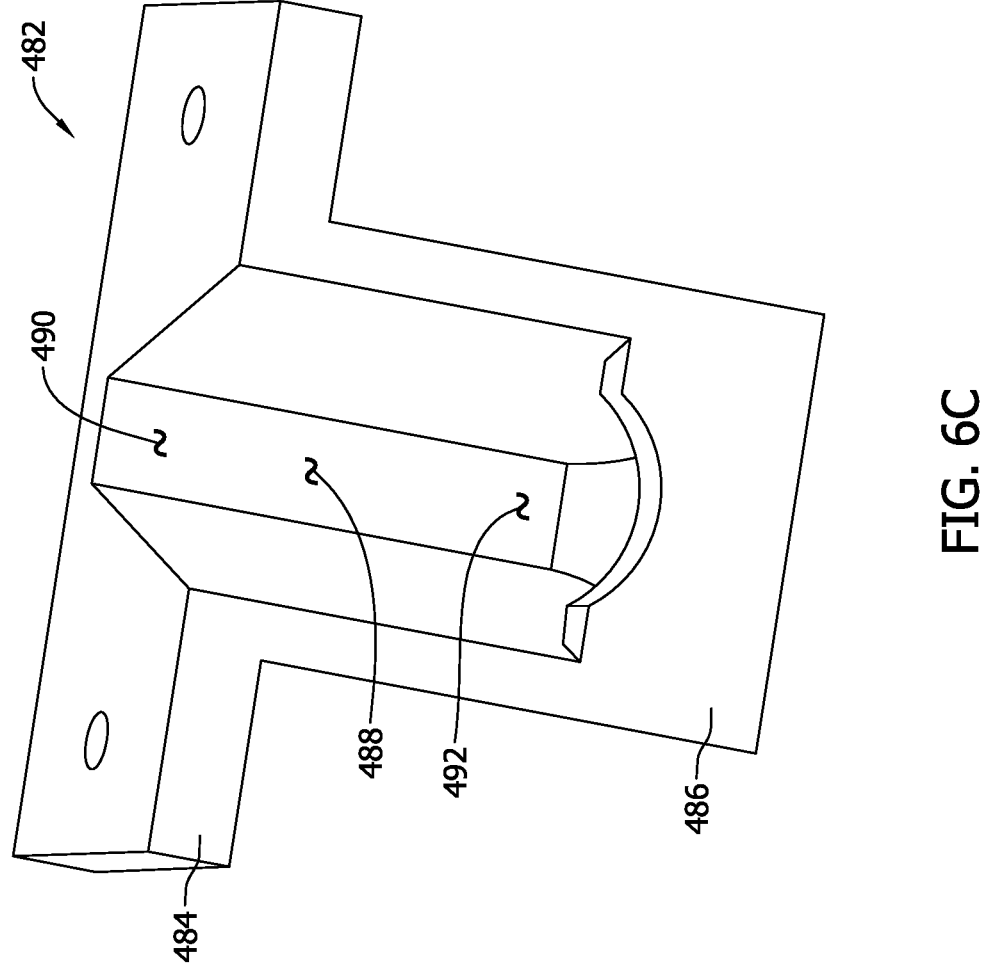
FIG. 6C is a detailed rear view of the frame shown in FIG. 6B.
Figure 6D:
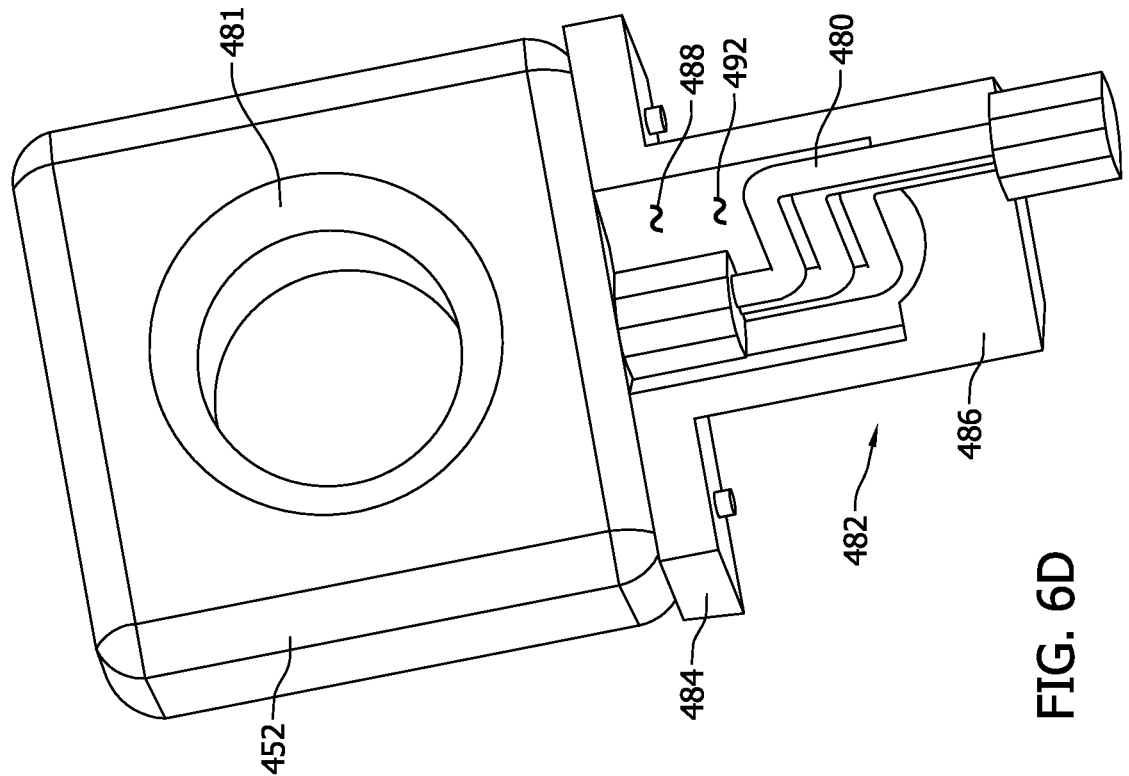
FIG. 6D is a detailed rear view of the current sensor and frame for use with the monitoring assembly.
Figure 6E:
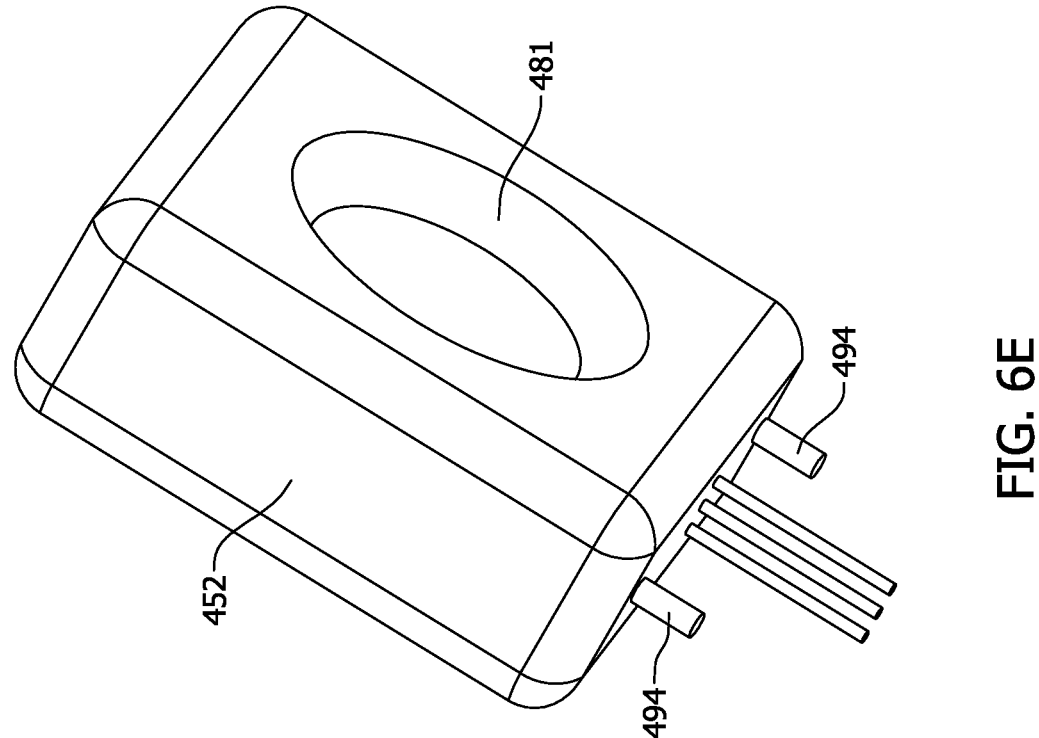
FIG. 6E is a detailed rear view of the current sensor for use with the monitoring assembly.
Figure 6F:
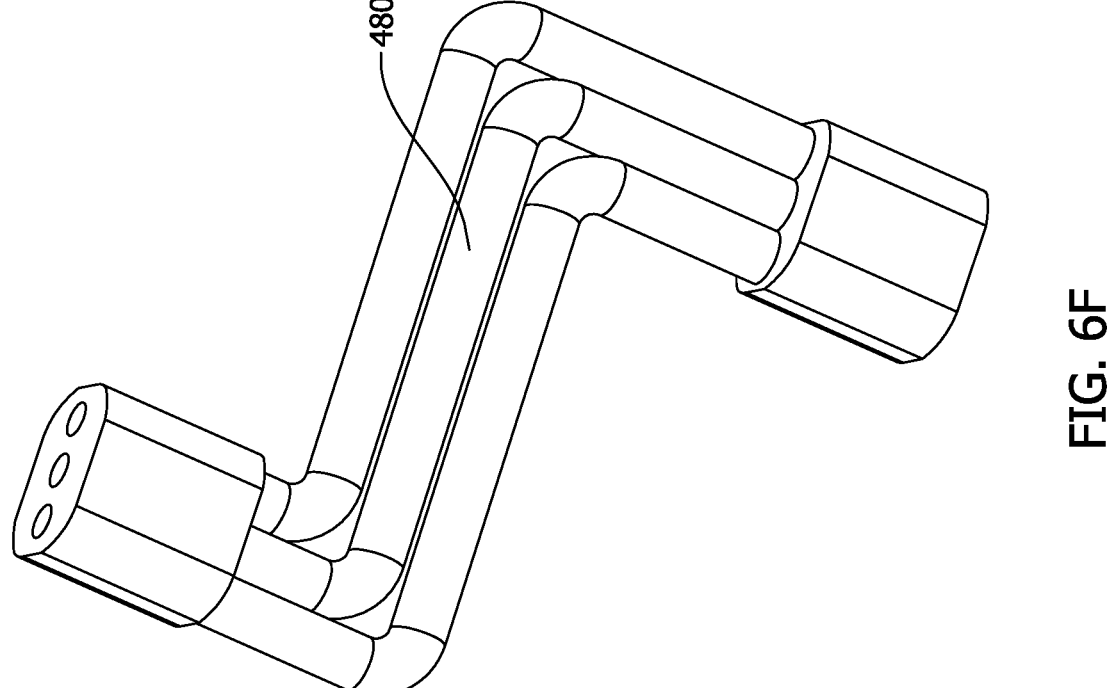
FIG. 6F is a detailed view of the wired connection of the current sensor.

When the fuse monitoring device 116 is retrofit onto one or more fuse blocks 112, the fuse monitoring device 116 is disposed in-between the one or more fuse blocks 112 and the mounting structure 250. As such, retrofitting the fuse monitoring device 116 merely shifts the fuse blocks 112 but does not increase a fuse block footprint area, described below, of the fuse blocks 112. The housing 302 includes a vertical axis Z, a first horizontal axis X and a second horizontal axis Y, both perpendicular to the vertical axis Z (FIGS. 4-6). The housing 302 includes a front side 308 and an opposing rear side 310. Both the front side 308 and the rear side 310 are arranged generally perpendicular to the first horizontal axis X. Both the top side 312 and the bottom side 314 are arranged generally perpendicular to the vertical axis Z. The housing 302 includes a height $H_A$, extending along the vertical axis Z from the bottom side 314 to the top side 312. Generally, the height $H_A$ is the overall height of the housing 302 which is sum of a height $H_B$ of the first housing 304 and the height $H_C$ of the second housing 306 (e.g., $H_A=H_C+H_B$).

In the exemplary embodiment, the first housing 304 and second housing 306 at least partially define a housing cavity 316 therein for storing electrical components, e.g., sensors 120. The first housing 304 and the second housing 306 are sized and shaped such that the housing cavity 316 accommodates the dimensions of the plurality of sensors 120 stored therein, while maintaining a small and compact overall height $H_A$ of the housing 302. For example, the first housing 304 and the second housing 306 are not oversized and the plurality of sensors 120 fit within the housing cavity 316 with a limited clearance C, visible in FIG. 3C, between the plurality of sensors 120, and the electronic components, and the first housing 304 and the second housing 306. The clearance C may be, for example, between 0-2.5 mm. The clearance C is selected to minimize the overall height $H_A$ of the housing 302. Accordingly, retrofitting the fuse monitoring device 116 with preexisting fuse blocks 112 and mounting structures 250 merely shifts the position of the one or more fuse blocks 112 in the vertical axis Z by a distance that is substantially equal to the height $H_A$ of the fuse monitoring device 116. The housing 302 further includes an exterior 318, defined outside of the housing 302, e.g., outside of the housing cavity 316.

In the exemplary embodiment, the fuse monitoring device 116 is sized and shaped such that the fuse monitoring device 116 is selectively connected to one or more fuse blocks 112 and the fuse monitoring device 116 does not increase the fuse block footprint area of the fuse blocks 112. Each of the fuse blocks 112 includes a length $L_A$ and a width $W_A$, FIG. 3A. Each fuse block 112 has a footprint area $A_A$ (e.g., $A_A=L_A\times W_A$). Three fuse blocks 112 connected to the fuse monitoring device 116 have an overall length of $L_B$ and a width of $L_B$. FIG. 3A. The three fuse blocks 112 are aligned side-by-side, and accordingly, the overall length $L_B$ is the same or substantially the same as the length $L_A$ and the width $W_B$ is three times as long as $W_A$. All three fuse blocks 112 have an overall footprint area $A_B$ (e.g., $A_B=L_B\times W_B$). The fuse monitoring device 116 is sized and shaped such that the fuse monitoring device 116 does not increasing the footprint area $A_A$ and/or the area $A_B$ of the fuse blocks 112. Accordingly, in the illustrated embodiment, the fuse monitoring device 116 includes a length Lc and a width $W_c$ such that fuse monitoring device 116 has a footprint area of $A_C$ (e.g., $A_C=L_C\times W_C$). Where the footprint area Ac is the same, or substantially the same as the overall footprint area $A_B$. For example, the length $L_c$ may be equal to $L_b$ and the width $W_c$ is equal to $W_b$.

Figure 7A:
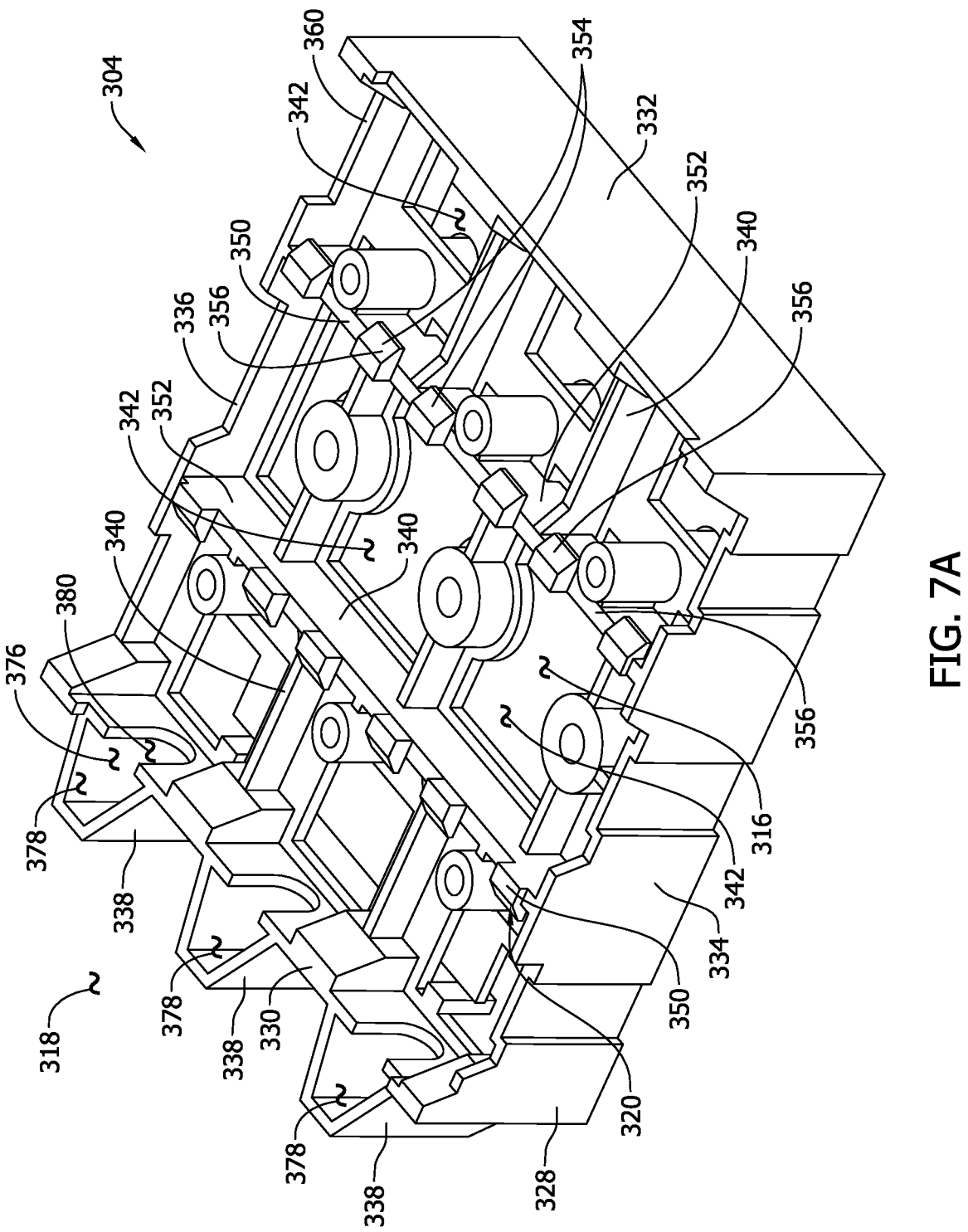
FIG. 7A is a top perspective view of the first housing.
Figure 7B:
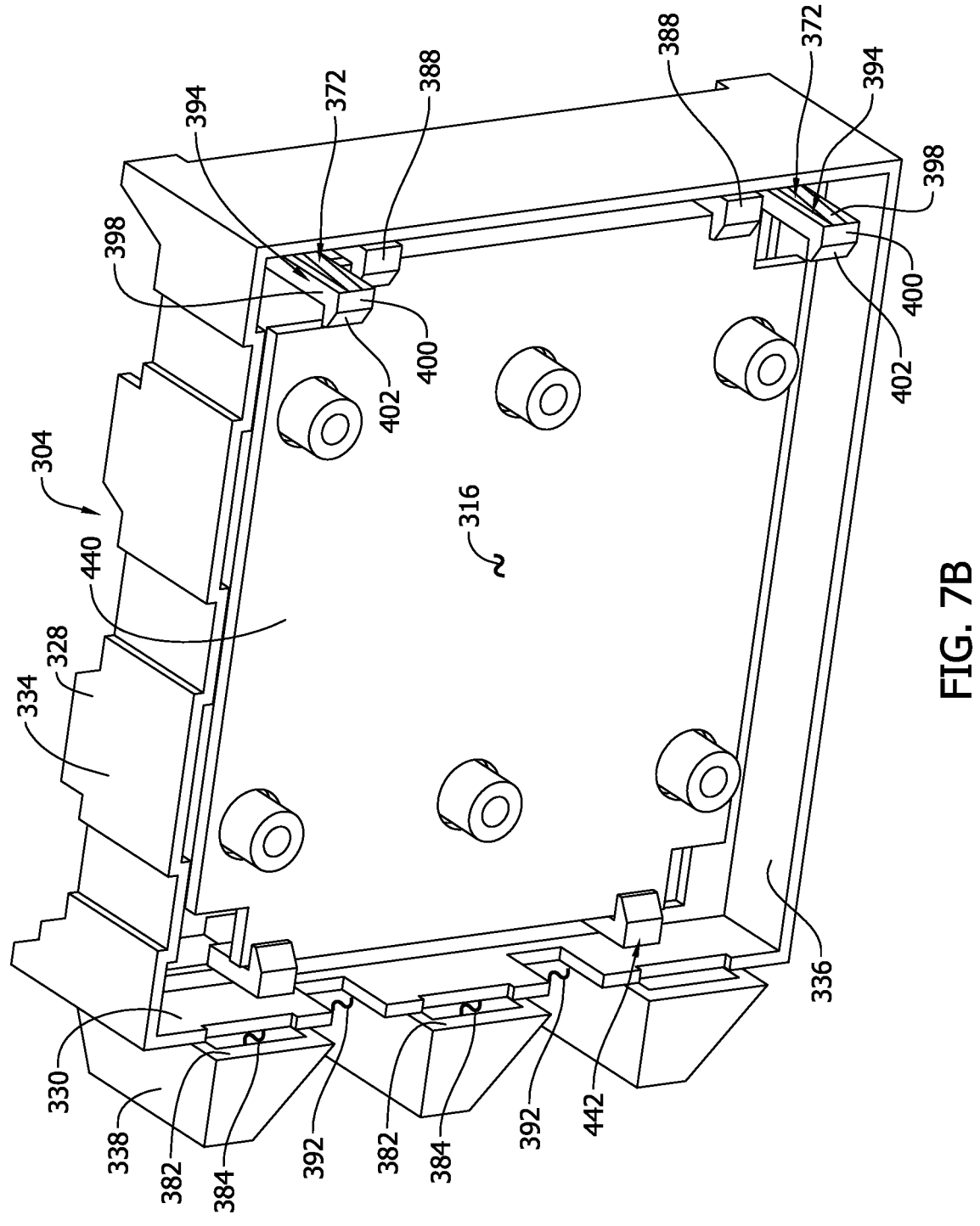
FIG. 7B is a bottom perspective view of the first housing.

In reference to FIGS. 7A and 7B, the first housing 304 includes an outer wall 328, e.g., a perimeter wall. The outer wall 328 includes a front wall 330 and an opposing rear wall 332 and a first side wall 334 and an opposing second side wall 336. The first housing 304 includes one or more mounting blocks 338 connected to, or formed integrally with, the outer wall 328. In the illustrated embodiment, the one or more mounting blocks 338 are connected to, or formed integrally with, the front wall 330 of the first housing 304.

In the exemplary embodiment, the first housing 304 is a frame-like structure with one or more cross-beams 340 extending generally perpendicularly relative to the outer wall 328. The cross-beams 340 provide rigidity and structure to the first housing 304 while allowing the first housing 304 to be reduced in weight as compared to a first housing formed of a solid, or more solid configuration. Furthermore, the cross-beams 340 defines one or more openings 342. The one or more openings 342 lead into the housing cavity 316. The one or more openings 342 allow for the passage of electrical components from within the housing cavity 316 to extend into the exterior 318 to the housing 302 such that the one or more electrical components, e.g., sensors 120, may be operably engaged with the fuse 110.

As mentioned above, the system 100 includes one or more of the holder attachment mechanisms 320 that connect the fuse monitoring device 116 to one or more fuse blocks 112. The holder attachment mechanism 320 includes the holder attachments 232, connected to the fuse block 112, and a second holder attachment 350 connected to the first housing 304. The holder attachments 232 and the second holder attachment 350 are sized and shaped to be mated together in frictional engagement. When the holder attachments 232 and second holder attachments 350 are frictionally engaged, the first housing 304 is connected to the fuse block 112. The holder attachments 232 and second holder attachment 350 may be any suitable components that enable the holder attachment mechanism 320 to connect the fuse monitoring device 116 to the fuse block 112 without the use of tools. For example, the holder attachment mechanism 320 may include any suitable connectors, fasteners, quick coupling devices that enable the fuse monitoring device 116 to connect to one or more fuse blocks 112.

In the exemplary embodiment, the second holder attachment 350 includes at least one wall 352, FIG. 7A. The second holder attachment 350 further includes one or more heads 354 disposed on the at least one wall 352. Each of the heads 354 includes a sliding surface 356 and an engagement surface 358. Contact between the engagement surface 358 and engagement surface 246 connects the fuse block 112 to the fuse monitoring device 116. Specifically, during the retrofitting process, the fuse block 112 and the fuse monitoring device 116 may be pressed together, in a direction substantially parallel to the vertical axis Z. As the fuse block 112 and the fuse monitoring device 116 are pressed together, initially the sliding surface 356 and sliding surface 244 are in contact with each other and slide relative to each other as the fuse block 112 is pressed into further engagement with the fuse monitoring device 116. The sliding surface 356, 244 eventually slip past one another, and the engagement surface 358 on the second holder attachment 350 will be positioned into contact with the engagement surface 246 on the holder attachment 232 securing the fuse block 112 to the fuse monitoring device 116. FIG. 3C shows the holder attachments 232 frictionally engaged with the second holder attachment 350.

In alternative embodiments, the retrofitting process may include pressing together the fuse monitoring device 116 and the fuse blocks 112 along a direction parallel to at least one of the first horizontal axis X and/or the second horizontal axis Y in order to connect the fuse monitoring device 116 to the fuse block 112 using the holder attachment mechanism 320.

The fuse monitoring device 116 includes one or more alignment features 360 that guide the fuse block 112 and the fuse monitoring device 116 as they are connected together using the holder attachment mechanism 320 (FIGS. 3C, 4, 6A, and 7A). For example, the alignment features 360 assists in maintaining the correct alignment between the holder attachments 232 and the second holder attachment 350 as the fuse monitoring device 116 and the fuse blocks 112 are pressed together. In the exemplary embodiment, the fuse block 112 includes a first alignment surface 362 extending from the base wall 206. The alignment features 360 define a cutout that is sized and shaped to receive therein the one or more of the alignment features 360 of the fuse blocks 112.

In the exemplary embodiment, the fuse monitoring device 116 is modular and may be adapted to monitor any number of fuses 110. As mentioned above, in the illustrated embodiment, the fuse monitoring device 116 may be connected to three fuse blocks 112. In the illustrated embodiment, the fuse monitoring device 116 includes two of the wall 352, a front wall and a back wall, extending generally parallel to each other and parallel to the secondary horizontal axis Y. Each of the walls 352 includes six heads 354 disposed on the walls 352. Each individual fuse block 112 includes two pairs of the holder attachments 232, a forward pair and a rearward pair. In other words, each fuse block 112 includes four of the holders attachments 232. The forward pair the holder attachments 232 are positioned to connect to two heads 354 disposed on the front wall 352. Similarly, the rearward pair of holder attachments 232 are positioned to connect to two heads disposed on the back wall 352. In alternative embodiments, the system 100 includes any suitable number of second holder attachments 350 and holder attachments 232 that enables the holder attachment mechanism 320 to connect the fuse blocks 112 to the fuse monitoring device 116. During some retrofitting processes, individual fuse blocks 112 may be connected to the fuse monitoring device 116 sequentially, e.g., one after the next. Alternatively, a plurality of fuse blocks 112 may be connected to the fuse monitoring device 116 in a single step.

In alternative embodiments, the holder attachment mechanism 320 may be any suitable attachment mechanism that enables fuse blocks 112 to be connected to the fuse monitoring device 116. In some alternative embodiments, the holder attachments 232 and the second holder attachments 350 may have different sizes and shapes. The shape and size of the second holder attachment 350 may be customizable, such that the second holder attachment 350 is suitable to be frictionally engaged with the holder attachments 232. Accordingly, the fuse monitoring device 116 is customizable such that the fuse monitoring device 116 may be connected to various types of fuse blocks 112 having various types of holder attachments 232.

Figure 8A:
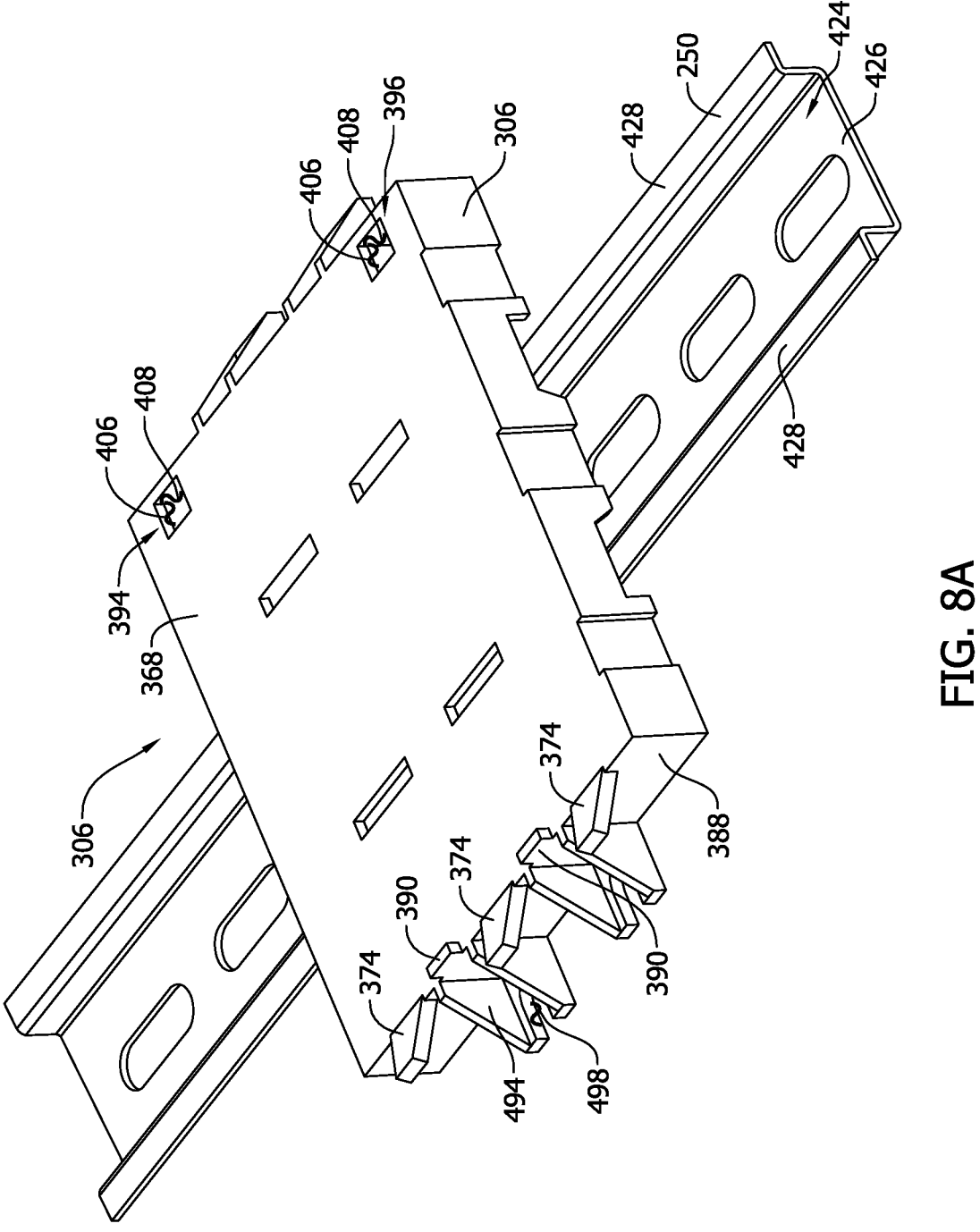
FIG. 8A is a top perspective view of the second housing.
Figure 8B:
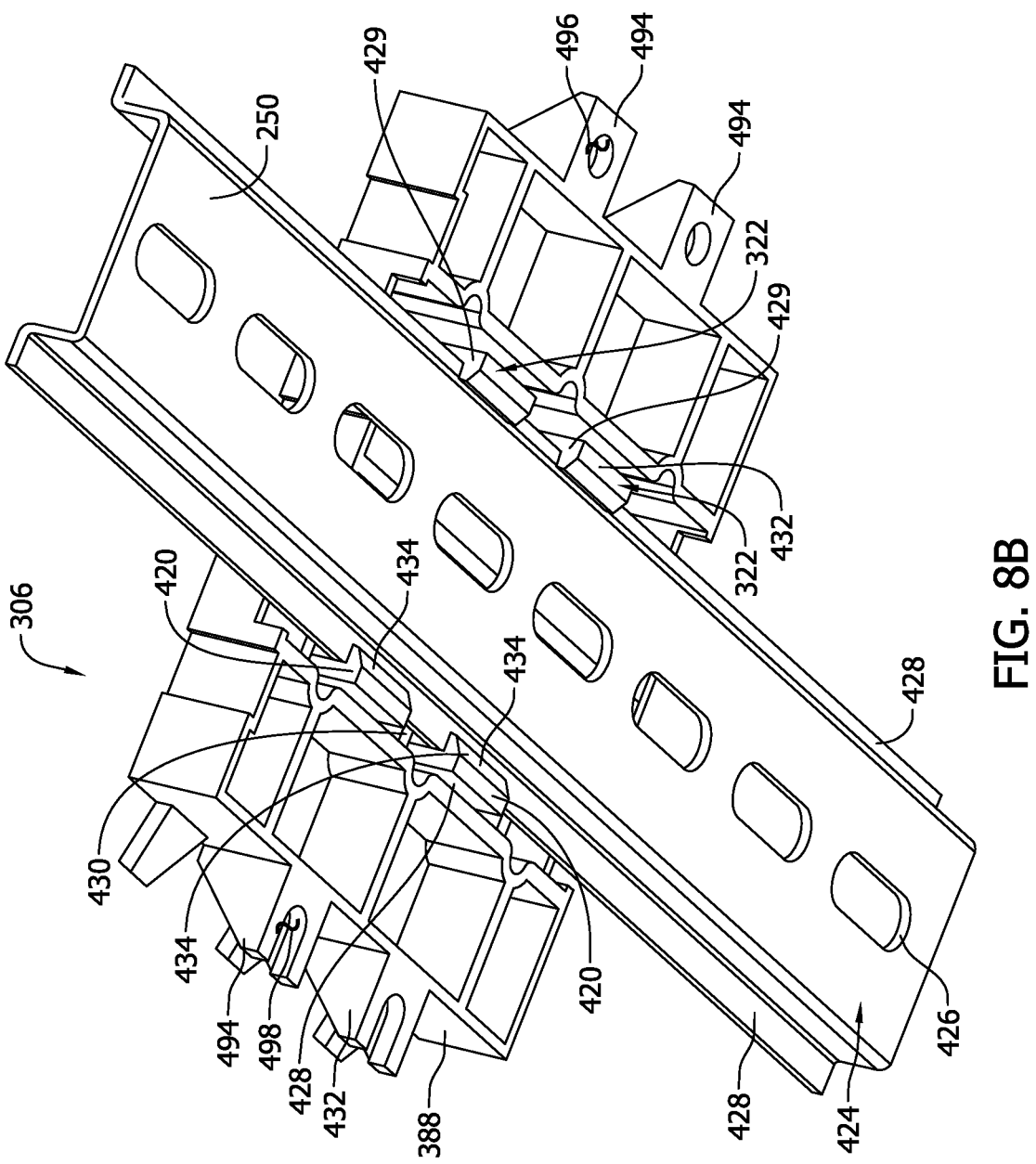
FIG. 8B is a bottom perspective view of the second housing.

In reference to FIGS. 8A and 8B, the second housing 306 may be selectively connected to the mounting structure 250 using the mounting attachment mechanism 322. In addition, the second housing 306 may be selectively connected to the first housing 304 using the housing attachment mechanism 324. The second housing 306 includes an upper surface 368. The upper surface 368, at least in part, defines the housing cavity 316 when the first housing 304 is connected to the second housing 306.

As mentioned above, the system 100 includes a housing attachment mechanism 324 used to connect the first housing 304 to the second housing 306. The housing attachment mechanism 324 may be any suitable mechanism that may be used to connect the first housing 304 to the second housing 306 without the use of tools. Furthermore, the housing attachment mechanism 324 is a selectable connection such that the first housing 304 and the second housing 306 may be selectively connected and/or disconnected. Accordingly, the housing attachment mechanism 324 allows a user to disconnect and reconnect the first housing 304 from the second housing 306 in order to access the contents of the housing cavity 316, for example.

In the illustrated embodiment, the housing attachment mechanism 324 includes a first mechanism 370, FIG. 3B, and a second mechanism 372, FIG. 3C (also see FIG. 7B). In the illustrated embodiment, the second mechanism 372 is a different configuration compared to the first mechanism 370. Alternatively, in some embodiments, the first mechanism 370 and second mechanism 372 have the same configuration. The first mechanism 370 and second mechanism 372 cooperate to connect the first housing 304 to the second housing 306. In the illustrated embodiment, the first mechanism 370 is arranged in proximity to the front side 308 of the housing 302 and the second mechanism 372 is arranged in proximity the rear side 310 of the housing 302.

The first mechanism 370, arranged in proximity to the front side 308, includes one or more prongs 374 and one or more slots 384. The one or more prongs 374 are connected to and extend outwards from the upper surface 368 of the second housing 306. In the illustrated embodiment, the prongs 374 extend at an angle α relative to the vertical axis Z (FIG. 7B). The slots 384 are defined by the one or more mounting blocks 338. In particular, the one or more mounting blocks 338 define a chamber 376 therein (FIG. 7A). The mounting block 338 also defines thereon an outer opening 378 and an inner opening 380. The outer opening 378 opens between the exterior 318 of the chamber 376. In the illustrated embodiment, the outer opening 378 and the inner opening 380 are connected. In alternative embodiments, the outer opening 378 and the inner opening 380 may not be connected. The mounting block 338 includes a wall 382 that defines, in part, the slot 384. The slot 384 opens between the chamber 376 and the housing cavity 316. In some embodiments, the slot 384 and chamber 376 are not connected, e.g., the slot 384 is formed separately from the chamber 376. The wall 382 is sized and shaped such that the prong 374 fits within the slot 384 with limited clearance between the prong 374 and the wall 382. The limited clearance fit is such that the wall 382 captures the prongs 374 preventing the prongs 374 from moving in a direction of the vertical axis Z and/or the second horizontal axis Y.

The slot 384 may at least be partially defined by the front wall 330 of the first housing 304. The slot 384 is further defined, at least in part, by an inner surface 386. FIG. 3C. The inner surface 386 is angled relative to the vertical axis Z. The angle of the inner surface 386 substantially matches the angle α. When the prong 374 is inserted into the slot 384, the prong 374 may be in contact with, e.g., rest upon, the inner surface 386. The prong 374 may be inserted into the slot 384, until a front surface 388 of the second housing 306 comes into contact with the front wall 330 and/or the wall 382 of the mounting block 338, preventing further progression of the prong 374 into the slot 384. When the prong 374 is disposed within the slot 384 and the front surface 388 is in contact with the front wall 330 and/or the wall 382, the prong 374 is completely captured within the slot 384.

In further reference to FIG. 8A, the second housing 306 includes one or more alignment blocks 390 connected to and extending, generally, from the upper surface 368 and/or the front surface 388 of the second housing 306. The first housing 304 also defines one or more of a recess 392. The recesses 392 may be defined in the front wall 330. Alternatively, the recesses 392 may be defined between adjacent mounting blocks 338. The recesses 392 are sized and shaped to receive the alignment blocks 390 therein. The alignment blocks 390 fit within the recesses 392 with minimal clearance between the alignment blocks 390 and the front wall 330. When the prongs 374 are captured within the slots 384, the alignment blocks 390 are disposed with the recesses 392. Contact between the alignment blocks 390 and the front wall 330 and/or the mounting blocks 338 restricts rotational motion, about the vertical axis Z, between the first housing 304 and the second housing 306. In addition, contact between the alignment blocks 390 and the front wall 330 and/or the mounting blocks 338 restricts translational motion, in a direction along the second horizontal axis Y, between the first housing 304 and the second housing 306. Furthermore, contact between the alignment blocks 390 and the front wall 330 and/or the mounting blocks 338 reinforces the position of the prongs 374 within the slot 384. The second mechanism 372, arranged in proximity to the rear side 310, includes a first component 394 connected to the first housing 304 and a second component 396 connected to the second housing 306. The first component 394 includes a beam 398 extending from the first housing 304. The first component 394 further includes a head 400 connected to the beam 398. The head 400 includes a sliding surface 402 and a first engagement surface 404. The second component 396 includes an opening 406 defined in the upper surface 368 of the second housing 306. The second housing 306 further defines a channel 408 and a capture surface 410. The head 400 is sized and shaped to be passed through the opening 406 and received within the channel 408. When the head 400 is disposed within the channel 408, the first engagement surface 404 may be in contact with the capture surface 410, restricting displacement between the first housing 304 and the second housing 306. In the illustrated embodiment, the fuse monitoring device 116 includes a pair of the second mechanisms 372 arranged near the rear side 310 of the housing. In alternative embodiments, the fuse monitoring device 116 includes any number of the second mechanisms 372, in any location, necessary to connect the first housing 304 to the second housing 306. FIG. 3C shows the first component 394 frictionally engaged with the second component 396, e.g., the first engagement surface 404 of the first component 394 is in contact with the capture surface 410 of the second component 396.

During an assembly process, the first housing 304 and the second housing 306 may be connected together using the first mechanism 370 and the second mechanism 372. In particular, the prongs 374 may be inserted into the slots 384 by moving the second housing 306, relative to the first housing 304, along both the vertical axis Z and the first horizontal axis X in order to guide the prongs 374 into the slots 384. The direction of motion needed to connect the second mechanism 372 depends on the angle α. For example, if the angle α is 90° the second housing 306 may be translated in a direction along the first horizontal axis, relative to the first housing 304, in order to insert the prongs 374 into the slots 384. Once the prongs 374 are inserted into the slot 384 and the front surface 388 of the second housing 306 comes into contact with the front wall 330, the second mechanism 372 is aligned for engagement. In particular, the head 400 is aligned with the opening 406 to the channel 408, when the prong 374 is completely captured within the slot 384 and the alignment blocks 390 are disposed within the recess 392. Next, the assembly process may further include pressing the first housing 304 and the second housing 306 together in a direction along the vertical axis Z in order to move the heads 400 into the channels 408 until the first engagement surface 404 contacts the capture surface 410.

In further reference to FIG. 8B, as mentioned above, the system 100 includes the mounting attachment mechanism 322 that enables the fuse monitoring device 116 to be connected to the mounting structure 250. The mounting attachment mechanism 322 includes a first component 420 connected to the second housing 306. The mounting attachment mechanism 322 includes a second component 422 connected to, and/or formed integrally with, the mounting structure 250. The first components 420 and second component 422 are sized and shaped to be mated together in frictional engagement to connect the fuse monitoring device 116 to the mounting structure 250. In the illustrated embodiment, the mounting structure 250 includes a rail 424. The rail 424 may be a DIN rail for mounting fuse. A DIN rail is a common mounting apparatus for electrical equipment and components. Switch devices in a panel board are often mounted on a DIN rail. The fuse monitoring fuse monitoring device 116 is configured to be amounted to the rail 424. As such, the fuse monitoring fuse monitoring device 116 may readily retrofitted with existing fuses and panel boards. The rail 424 includes a middle portion 426 and a pair of opposing flanges 428 extending from the middle portion 426. The mounting structure 250 may be any suitable structure that allows at least one of fuse blocks 112 and/or the fuse monitoring device 116 to be connected or mounted thereto.

The first component 420, visible in FIG. 8B, includes a member 429 extending from a lower surface 430 of the second housing 306. The first component 420 further includes a head 432 connected to the member 429. The head 432 includes a sliding surface 434 and an engagement surface 436. The second housing 306 may be coupled to the mounting structure 250 by moving the second housing 306 towards the mounting structure 250, along the vertical axis Z. Initially, as the fuse monitoring device 116 is pressed onto the mounting structure 250, the sliding surface 434 comes into contact the flange 428. In the illustrated embodiment, the sliding surface 434 is angled relative to the flange 428. The sliding surface 434 slides against the flange 428, until the head 432 moves past the flange 428, in a direction along the vertical axis Z, and the flange 428 becomes disposed between the engagement surface 436 and the lower surface 430 of the second housing 306, capturing the flange 428 therebetween and securing the connection between the mounting structure 250 and the fuse monitoring device 116.

In further reference to FIGS. 8A-8B, the fuse monitoring device 116 may include one or more mounting flanges 496 extending outwards from the second housing 306. The mounting flanges 496 may include one or more apertures 498 sized and shaped to allows fasteners, such as screws and bolts, to be passed through to connect the fuse monitoring device 116 to one or more mounting structures, e.g., such as mounting structure 250.

In the illustrated embodiment, the mounting attachment mechanism 322 may be the same, or substantially similar, as the holder attachment mechanism 320. In embodiments, wherein the fuse monitoring device 116 is retrofitted onto an existing fuse block 112, initially, the fuse block 112 is already mounted to the mounting structure 250. The fuse monitoring device 116 connects to the fuse blocks 112, replacing the mounting structure 250 which was previously connected to the fuse blocks 112.

In reference again to FIG. 7B, the housing cavity 316 stores therein the circuitry of the fuse monitoring device 116, e.g., the housing cavity 316 may store therein the processor 118 (not visible), the plurality of sensors 120, the memory 164 (not visible), and the transmitter 166 (not visible). In the illustrated embodiment, the processor 118, the memory 164, the transmitter 166 and the sensors 120 are electrically connected by a circuit board 440. The circuit board 440 is stored within the housing cavity 316. In some embodiments, the memory 164 and the transmitter 166 are formed integrally with the processor 118. The fuse monitoring device 116 may include any suitable electronic components that enable the system 100 to function as described herein. For example, in the exemplary embodiment, the fuse monitoring device 116 includes one or more voltage relays, for example.

The fuse monitoring device 116 includes one or more shelves 442 having a shelf surface 444 that supports the circuit board 440 thereon. For example, at least a portion of the circuit board 440 rests on the shelf surface 444. In some embodiments, the circuit board 440 may be connected to the shelves 442 using suitable adhesives. The fuse monitoring device 116 may include any number of shelves 442 necessary to support the circuit board 440. In the illustrated embodiment, the fuse monitoring device 116 includes four shelves 442 which supports each of the four sides of the circuit board 440 that may be generally rectangular in shape. In alternative embodiments, the circuit board 440 may be any shape and/or size and may be connected to either the first housing 304 and/or the second housing 306 using any suitable fasteners.

In the illustrated embodiment, the shelves 442 are spaced from housing attachment mechanism 324, in a direction along the vertical axis Z (FIG. 3C). Accordingly, when the circuit board 440 is supported by the shelves 442, the circuit board 440 is spaced from the second housing 306.

Sensors

The electrical sensors 160 may include a resistance sensor (not shown) configured to measure resistance, a voltage sensor 450 configured to measure voltage across the fuse, a current sensor 452 configured to measure at least one of input and output current of the fuse 110, and/or fuse temperature sensor 454 configured to measure fuse temperature. Determining resistance using the resistance sensor 448 may include determining the resistance using sensor data collected from the voltage sensor 450 and/or the current sensor 452. The electrical sensors 160 are each operably coupled to the fuse 110 for direct measurement of the fuse performance parameters. In some embodiments, a resistance sensor is not included, and the resistance is calculated using data collected from the voltage sensor 450 and/or the current sensor 452 using the formula that Resistance is equal to Voltage divided by Current.

In a contemplated system of the disclosure, the measurement of the fuse resistance may be made with precision by injecting a known currents across the fuse element 178. For example, the system may measure the non-linear fuse resistance while it is in service, and algorithms may be developed to assess the changes in resistance and estimate a temperature of the fuse element 178 based on the resistance of the fuse 110 and the ambient thermal conditions.

In the illustrated embodiment, the fuse monitoring device 116 includes three of the voltage sensors 450 which may be operably engaged with each of the fuses 110 supported by the fuse blocks 112 connected to the fuse monitoring device 116. FIG. 3A illustrates the connection of the voltage sensor 450 to the fuse block 112. The voltage sensor 450 includes a first lead 460 and a second lead 462. The first lead 460 is operably coupled to the first fuse contact terminal 224 on one side of the fuse receptacle 220 near the end edge 214.

The second lead 462 is operably connected to the second fuse contact terminal 226 on another side of the fuse receptacle 220 near the end edge 212. Accordingly, the voltage sensor 450 is operably coupled in parallel to the fuse 110 to detect the voltage across the fuse 110. The voltage sensor 450 further includes a wire connector 464 disposed at distal ends 466 of the each of the first lead 460 and the second lead 462. The wire connector 464 may be a U-shaped terminal or a ring-shaped terminal. The wire connector 464 may be connected the fuse contact terminals using a fastener, e.g., a screw 468.

The first lead 460 and second lead 462 includes a first portion 470 and a second portion 472. The first portion 470 extends upwards from the circuit board 440 generally in a direction along the vertical axis Z. The first portion 470 extends through fuse channel 252in the fuse block 112 and coupled to the circuit board 440, sending the detected voltage signals to the circuit board 440 (FIGS. 3B and 3C). The fuse channel 252 in a pre-existing fuse block 112 was originally for coupling the fuse block 112 to the panel board or a DIN rail. As such, the voltage sensor 450 may be readily retrofitted with the fuse block 112 and does not interfere the function or increase the footprint of the fuse block 112. The second portion 472 is arranged at an angle relative to the first portion 470 (FIG. 5). For example, the second portion 472 and the first portion 470 are arranged at 90° relative to each other. The first lead 460 and second lead 462 may be flexible such that the first and second leads 460, 462 may be positioned during the assembly and/or the retrofitting processes. For example, the first lead 460 and the second lead 462 may be passed through the opening 342 on the first housing 304, such that the distal end 466 is disposed outside of the housing cavity 316. During the retrofitting process, the distal ends 466 may be passed through the channel 252 formed on the fuse block 112.

In the exemplary embodiment, the voltage sensor 450 is configured to measure voltage across the fuse 110. The fuse voltage may be used to diagnose the status of the fuse and/or performance of the fuse. The voltage sensor 450 is also configured to measure system voltage, such as voltage on each phase of the power supply, providing information for systematic diagnosis. For example, if one phase is consistently has a higher voltage than other phases, the system 100 may provide a recommendation to a user that the loads of the phases are unbalanced and may need to be adjusted.

In the exemplary embodiment, the electrical sensors 160 includes one or more current sensors 452, e.g., current transducers sensors or current transformers. The fuse monitoring device 116 includes three current sensors 452 which are operably engaged to each of the fuses 110 supported by the fuse blocks 112. The current sensors 452 include a wired connection 480 between the circuit board 440 and a core 481 of the current sensor 452. The current sensor 452 which uses a magnetic field to detect the current in the fuse 110. The current sensor 452 measures the current of the fuse passively, without interrupting the circuit of the fuse 110.

In the exemplary embodiment, the fuse monitoring device 116 includes a frame 482 used for mounting the current sensor 452 to the housing 302. In reference to FIGS. 6B-6F showing a detailed view of the current sensor 452 and the frame 482, the frame 482 is generally t-shaped having an upper member 484 and a lower member 486 arranged generally perpendicularly to the upper member 484. The frame 482 defines a frame channel 488 that is sized and shaped to receive one or more components of the current sensor 452, e.g., wired connection 480. The frame channel 488 extends between an upper opening 490 defined in the upper member 484 and a lower opening 492 defined in the lower member 486 (FIG. 3B). The upper member 484 is connected to the core 481. For example, the upper member 484 may be fastened to the current sensor 452 using screws or pins 494. Alternatively, the core 481 may be connected to the upper member 484 using adhesives. The wired connection 480 may be directed through the frame channel 488 by threading the wired connection 480 through the frame channel 488 such that the wired connection 480 exits through the lower opening 492.

As mentioned above, the lower member 486 is arranged within the chamber 376 of the mounting block 338. FIG. 5. The lower opening 492 is aligned with and/or coincident with the inner opening 380 of the mounting block 338. Accordingly, the wired connection 480 may be directed out of the lower opening 492 and out of the mounting block 338 through the inner opening 380 and into the housing cavity 316 such that the wired connection 480 may be electrically coupled to the circuit board 440.

In the exemplary embodiment, the wired connection 480 is preassembled, e.g., the wired connection 480 may be already threaded through the frame channel 488 and electrically connected to the circuit board 440. Accordingly, an operator performing the retrofitting process does not need to assemble the current sensor 452.

The fuse temperature sensor 454 is coupled to the fuse 110, for example, in contact with the fuse 110, and/or in sufficient proximity to the fuse 110. The first housing 304 and/or the second housing 306 may include one or more openings, not shown, such that at least a portion of the fuse temperature sensor 454 may extend out of the housing 302 in order to be operably engaged with the fuse 110. The fuse temperature sensor may be mounted on the load side terminal 228 and/or the line side terminal 230. When the fuse temperature sensors are mounted on both the load side 228 and the line side 230, the detected temperatures may provide increased amount of information for diagnosis. For example, the temperatures may indicate the fuse itself is hot due to overcurrent or the terminal is hot due to loose wire connections.

In the exemplary embodiment, the fuse monitoring device 116 includes an ambient temperature sensor configured to measure the temperature in proximity to the fuse 110 and an ambient humidity sensor configured to measure the humidity in proximity to the fuse 110. In some embodiments, the one or more sensors 120 may also include an ambient pressure sensor, not shown. In an alternative embodiment, the fuse monitoring device 116 includes suitable sensors 120, such as a vibration sensor configured to measure vibration and a force sensor configured to measure shock to which the fuse 110 may be exposed. The vibration sensor is an inertial sensor or an accelerometer which detects accelerations and/or vibrations of the fuse 110. In some embodiments, the vibration sensor is used to detect and measure shock and/or impact experienced by the fuse 110. The force sensor may include a load cell, a strain gauge, and/or a resistor.

The environmental sensors 162 which are configured to measure environmental conditions may be selectively positionable relative to the fuse 110, such that the environmental sensors 162 may be arranged in sufficient proximity to the fuse 110 so that the environmental sensors 162 measure environmental conditions to which the fuse 110 is exposed. Positioned in proximity refers to a relative spatial position between the fuse 110 and the one or more sensors 120. In some embodiments, the environmental sensors 162 may be mounted within 30 cm of the fuse 110 (for example, within a range of 0 cm to 30 cm from the actual fuse location), for example. In other example embodiments, the environmental sensors 162 may be mounted within 15 cm of the fuse 110 (such as within a range of 0 cm to 15 cm from the actual fuse location, for example). In other embodiments, the environmental sensors 162 are positioned in sufficient proximity to the fuse 110 to enable the one or more environmental sensors 162 to measure the environmental conditions to which the fuse 110 is exposed.

In some embodiment, the housing includes one or more openings, e.g., openings 342, leading into the housing cavity 316. The one or more environmental sensors may be arranged in proximity to the openings. The openings allow the environmental sensors 162 to be exposed to the environmental conditions of the exterior of the housing. In some other embodiments, the environmental sensors 162 may be coupled to the exterior 318 of the housing. The fuse monitoring device 116 may include any suitable number and type of sensor that enables the fuse monitoring device 116 to monitor the fuse 110. For example, the fuse monitoring device 116 may include greater or fewer numbers of electrical sensors 160 and/or environmental sensors 162 (including one and only one current sensor) could likewise be provided in alternative embodiments).

The contents stored within the housing cavity 316, such as, the processor 118 and the plurality of sensors 120, are accessible without requiring the fuse monitoring device 116 to be disconnected from the fuse 110 and/or the fuse block 112. More specifically, the fuse monitoring device 116 may be connected to one or more fuses 110 and/or the fuse block 112, and subsequently, an operator may access the contents of the housing cavity 316 by decoupling or disengaging the first housing 304 from the second housing 306. Opening of the housing provides an operator with a readily access to the contents stored within the housing cavity 316, without requiring the operator to disengage the housing, in its entirety, from the fuse 110 or the fuse block 112. An operator may open the housing 302 to perform maintenance operations, such as, inspect, replace, or repair one or more of the contents within the housing cavity 316. For example, and without limitation, an operator may open the housing to replace one or more of the environmental sensors 162. Opening of the housing allows a maintenance procedure to be performed without disruption of the fuses 110.

Furthermore, in the exemplary embodiment, the fuses 110 are accessible without requiring opening of the housing 302. For example, an operator may readily access the fuses 110 that are being monitored by disconnecting the fuse monitoring device 116, without requiring the operator to open the housing 302. Removal of the housing 302, to access the fuses 110 without opening the housing 302, reduces exposure of the contents of the housing cavity 316 from potential harmful conditions, e.g., exposure of the one or more sensors 120 stored within the housing cavity 316, to debris or liquids. Furthermore, the fuse monitoring device 116 may be disconnected from the fuse 110 and/or fuse block 112 for replacement and/or repair of the fuse monitoring device 116, for example for an upgrade (e.g., software upgrade). In yet another example, the fuse monitoring device 116 may be replaced with an alternative fuse monitoring device 116 having one or more of the plurality of sensor 120 rated for specific conditions and/or environmental conditions. For example, for the fuse monitoring device 116 used in an EV application that typically travels in a climate in which has an annular mean temperature of 30°, for example, is now used in a climate in which the annular mean temperature is 10° C. Accordingly, the fuse monitoring device 116 may be exchanged with another fuse monitoring device 116 having an ambient temperature sensor that is rated for the climate of the location of the EV.

In some embodiments, the housing defines a first port, not shown, that is sized and shaped such that a cable (e.g., USB connection or any suitable connection, not shown) may be passed through the first port to be operably coupled to the circuitry contained within the housing cavity 316, e.g., the circuit board 440 and/or the processor 118 contained within the housing. The housing also includes a second port that is sized and shaped such that a display cable may be passed through the second port to be operably coupled to the processor 118 contained within the housing cavity 316. The housing may include any suitable number and/or configuration of ports that allow access to one or more components stored within the housing cavity 316.

Figure 9:
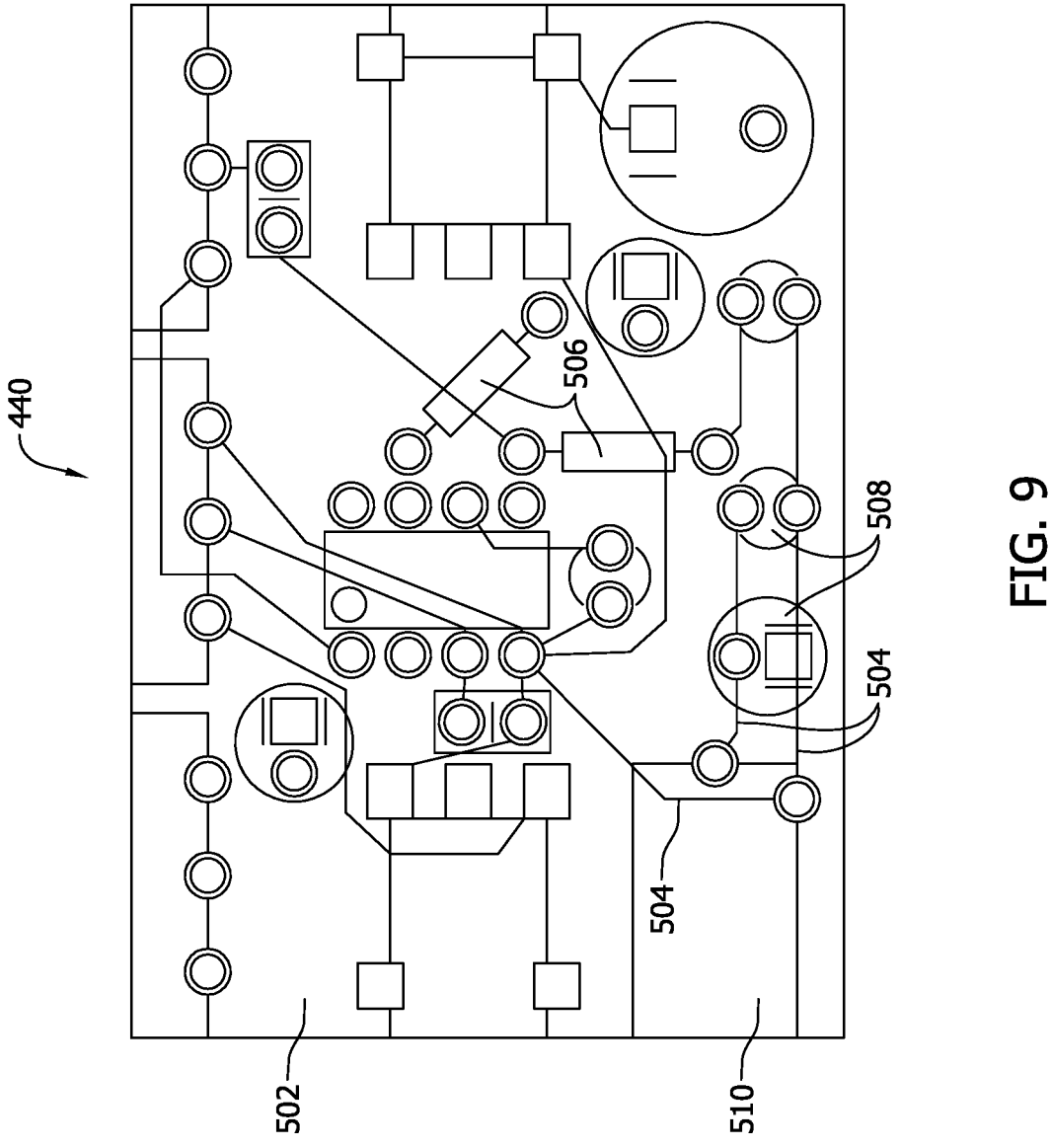
FIG. 9 is a plan view of an exemplary circuit board for use with the fuse monitoring device.

FIG. 9 shows an exemplary circuit board 440 for electrically connecting one or more electrical components of the fuse monitoring device 116. The circuit board 440 may be constructed of a non-conductive substrate 502 that supports copper circuitry lines 504 therebetween. The circuitry lines 504 electrically connects one or more of the electrical components of the fuse monitoring device 116. For example, each of the sensors 120, the processor 118, the transmitter 166, the memory 164 are electrically connected using circuitry lines 504. The circuit board 440 may support one or more additional electrical components for use with the electrical components of the fuse monitoring device 116. In the illustrated embodiment, the circuit board 440 includes one or more resistors 506 and one or more capacitors 508. Circuit board 440 may also include, and/or is electrically connected to one or more power supplies 510 that supplies power to one or more of the electrical components of the fuse monitoring device 116.

Figure 10:
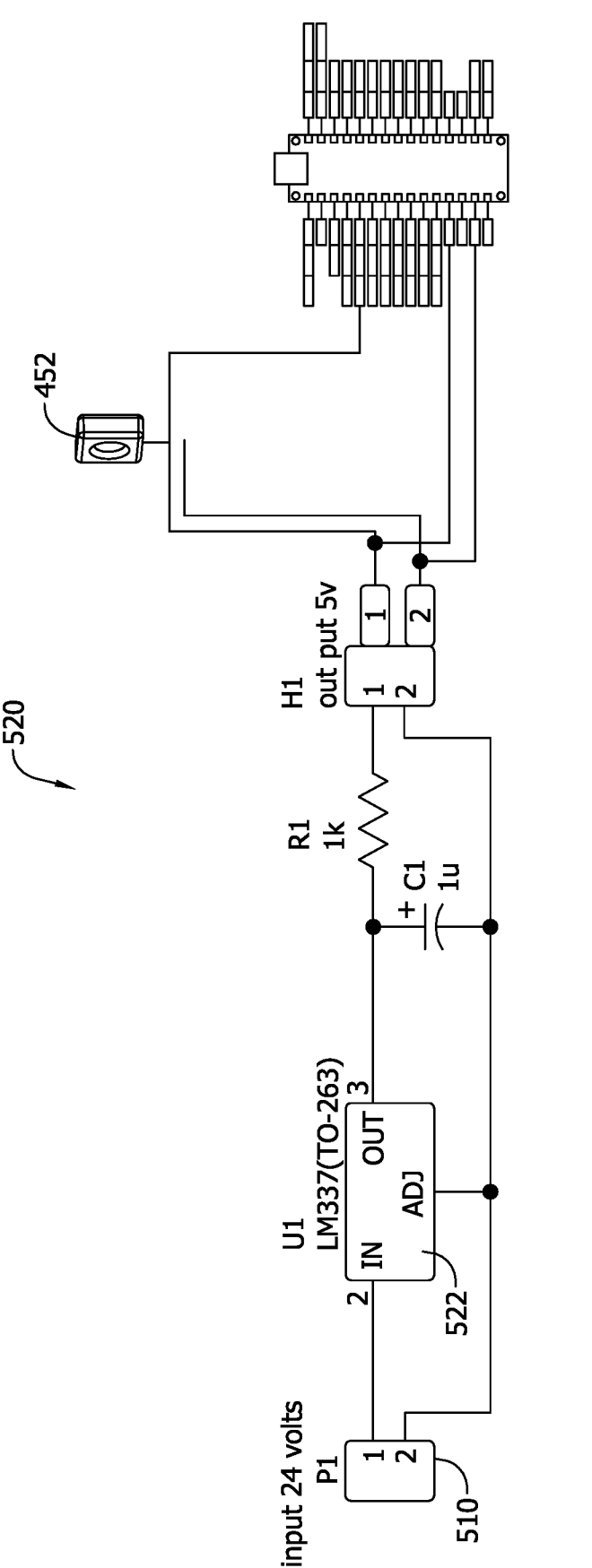
FIG. 10 is a circuit diagram of a current sensor for use with the monitoring device.

FIG. 10 shows a diagram of an exemplary current sensor circuit 520 for the current sensor 452. The current sensor 452 is electrically connected, in parallel to a resistor R1 and electrically connected, in series with a capacitor C1. Power is supplied to the current sensor 452 by the power supply 510. The current sensor circuit 520 may further include a voltage regulator 522 to maintain a voltage supplied to the current sensor 452, regardless of the input voltage supplied by the power supply 510. In the illustrated embodiment, the power supply 510 produces 24 volts.

Figure 11:
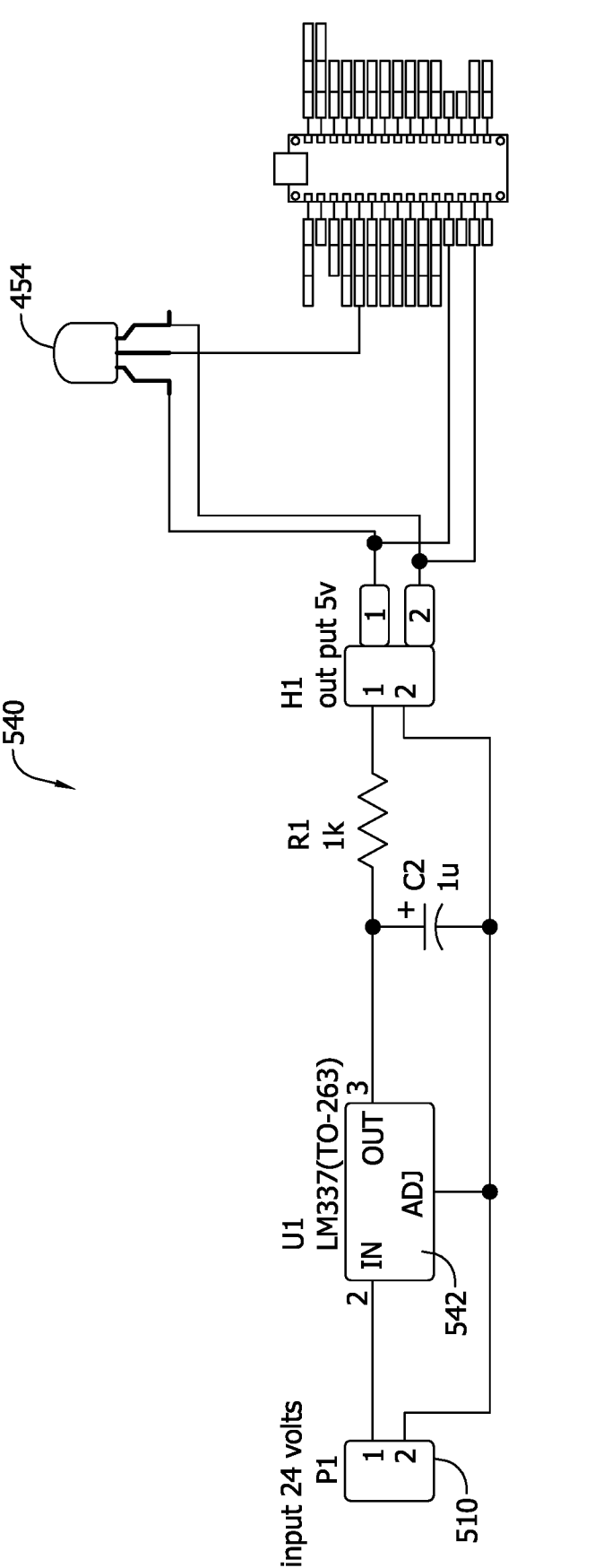
FIG. 11 is a circuit diagram of a temperature sensor for use with monitoring device.

FIG. 11 shows a diagram of an exemplary temperature circuit 540 for the fuse temperature sensor 454. The temperature circuit 540 includes the fuse temperature sensor 454 electrically connected in parallel to a resistor R2 and electrically connected, in series with a capacitor C2. Power is supplied to the temperature sensor by the power supply 510. In the illustrated embodiment, the power supply 24 produces 24 volts. The temperature circuit 540 may further include a voltage regulator 542 to maintain a voltage supplied to the temperature sensor 454, regardless of the input voltage supplied by the power supply 510.

User Interface

Figure 12:
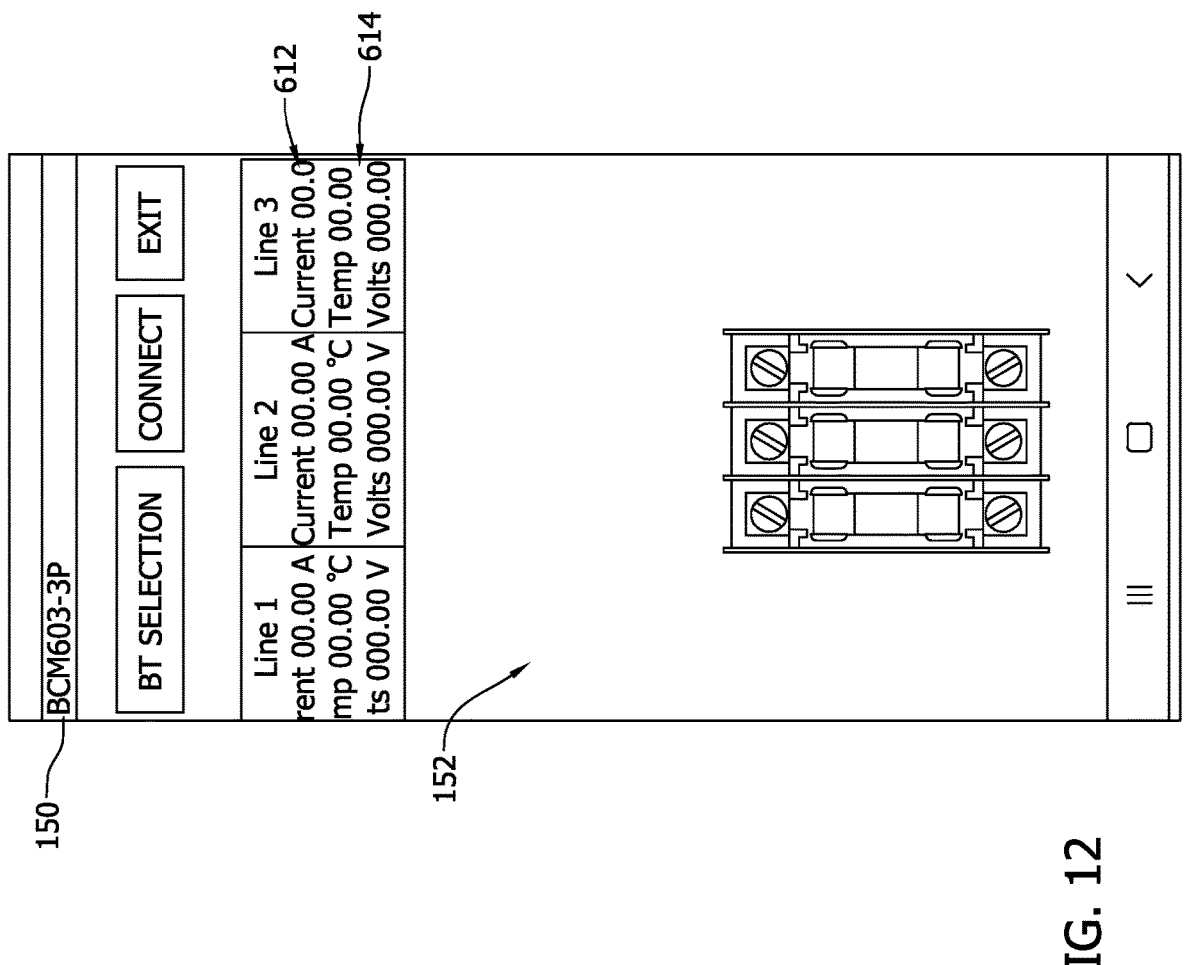
FIG. 12 illustrates a view of an exemplary user interface used to monitor the fuse for use with the system shown in FIGS. 1A and 1B.

FIG. 12 illustrates a view of an exemplary user interface 152, displayed on the user computing device 150. The user interface 152 enables monitoring of the fuse 110 using the system 100 as shown in FIGS. 1A and 1B. In the exemplary embodiment, the user interface 152 may be displayed on any suitable user computing device 150 enabling a user to monitor the fuse 110. In the exemplary embodiment, the user interface 152 displays real-time fuse performance parameters 612 and real-time environmental conditions 614 of the fuse 110, measured by the one or more sensors 120. The real-time fuse performance parameters 612, including voltage, current, resistance, and fuse body temperature, are graphically displayed using both a metered gauge and a digital display. The real-time environmental conditions 614 of the fuse 110 are digitally displayed. The real-time environmental conditions displayed include ambient temperature, ambient humidity, and fuse block 112 vibrations. In some embodiments, the user interface 152 also displays the remaining service life, e.g., using a scale to illustrate a percent remaining service life. The user interface 152 may display real-time fuse performance parameters 612 and real-time environmental conditions 614 of the fuse 110 using any suitable graphical or digital displays. Additionally, the user interface 152 may display any suitable data that enables system 100 to function as described herein. In some example embodiments, the user interface 152 may display one or more determined metrics, e.g., average ambient temperature.

In some embodiments, the user interface 152 may be interactive, allowing a user to submit one or more query messages to the computing device 130. For example, the user interface 152 may include one or more user inputs, such as buttons, toggles, and/or drop-down menus, enabling a user to select information to be displayed on the user interface 152. For example, a user may desire to know a peak voltage at which the fuse 110 will fail, the user may engage with the system 100 via the user interface 152 to obtain this information, for example, a query message is transmitted from the user computing device 150 to the computing device 130 and the computing device 130 may retrieve data that is stored within the fuse database 140, and then the computing device 130 transmits a message to the user computing device 150 to be displayed on the user interface 152.

In some embodiments, a view of the user interface 152 may include a fuse identification number that uniquely identifies the fuse 110 being monitored by the system 100. The user interface 152 also displays one or more fuse details that may be used to identify the fuse 110, such as a fuse class, a fuse rating, and/or any other details regarding the fuse 110. For example, in some embodiments, the user interface 152 may display a location of the fuse 110, an application of the fuse 110 (e.g., EV or industrial), and/or an installation date of the fuse 110. The user interface 152 may display any suitable fuse details that enable the system 100 to function as described herein.

Figure 13A:
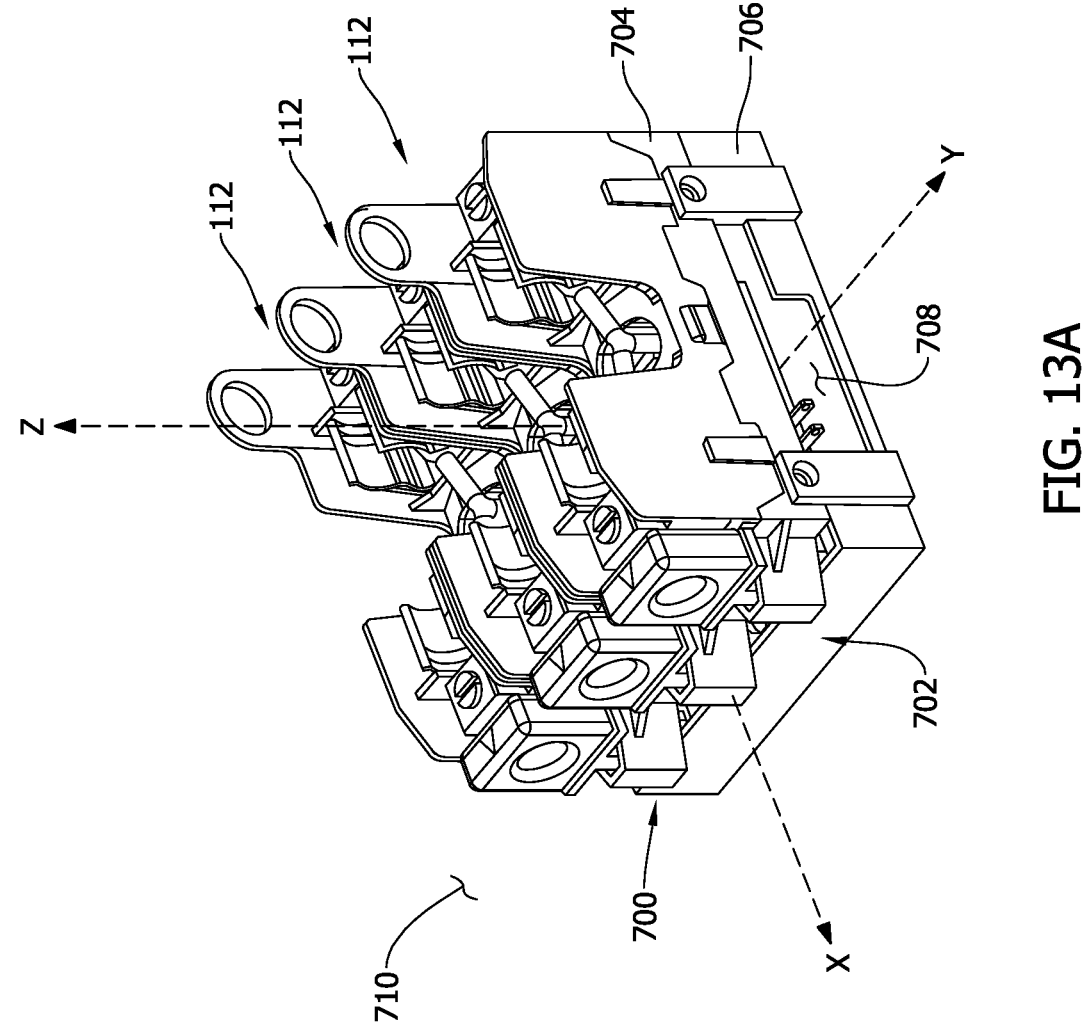
FIG. 13A is a perspective view of another exemplary fuse monitoring assembly for use with the fuse monitoring system shown in FIGS. 1A and 1B, wherein the fuse monitoring assembly includes a fuse monitoring device connected to fuse blocks.
Figure 13B:
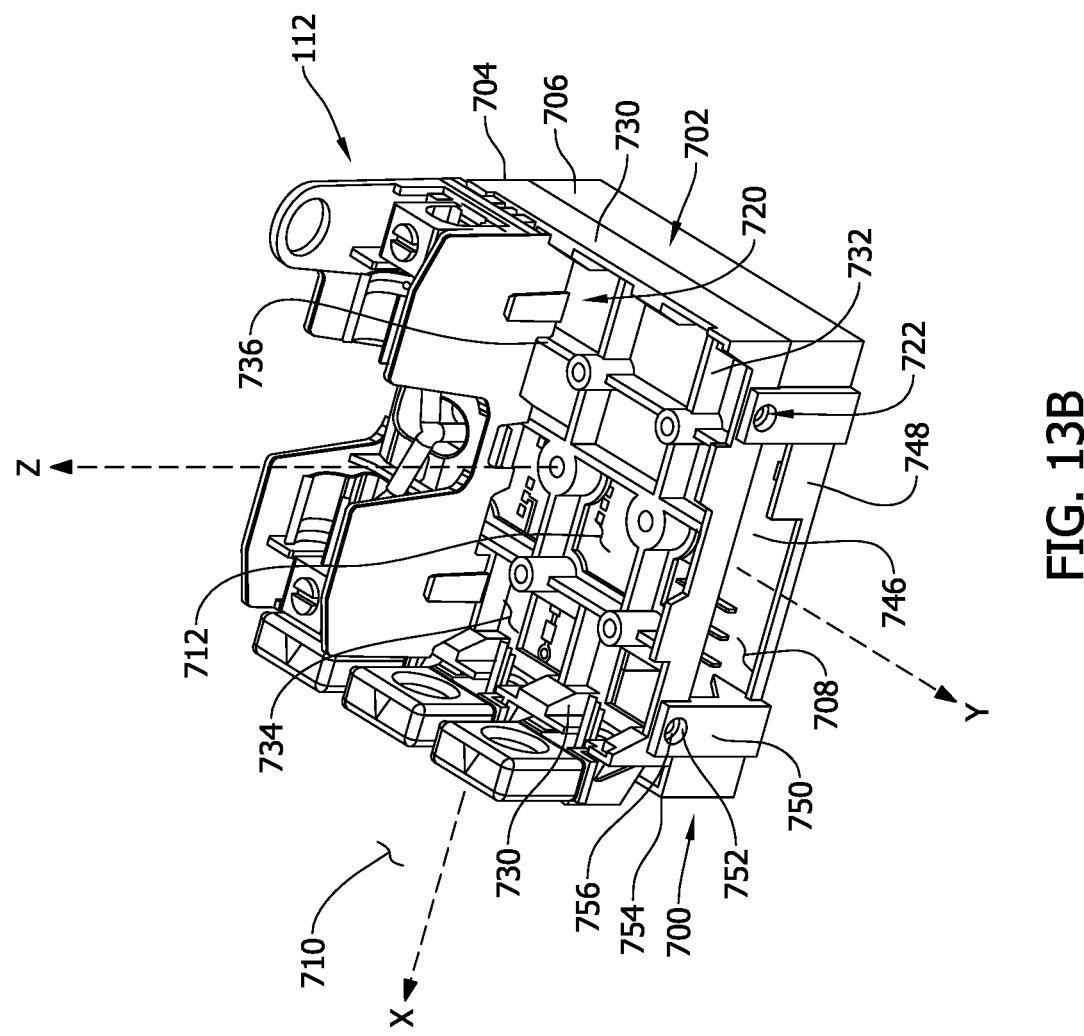
FIG. 13B is a perspective view of the fuse monitoring device shown in FIG. 13A with two fuse blocks removed therefrom.
Figure 13C:
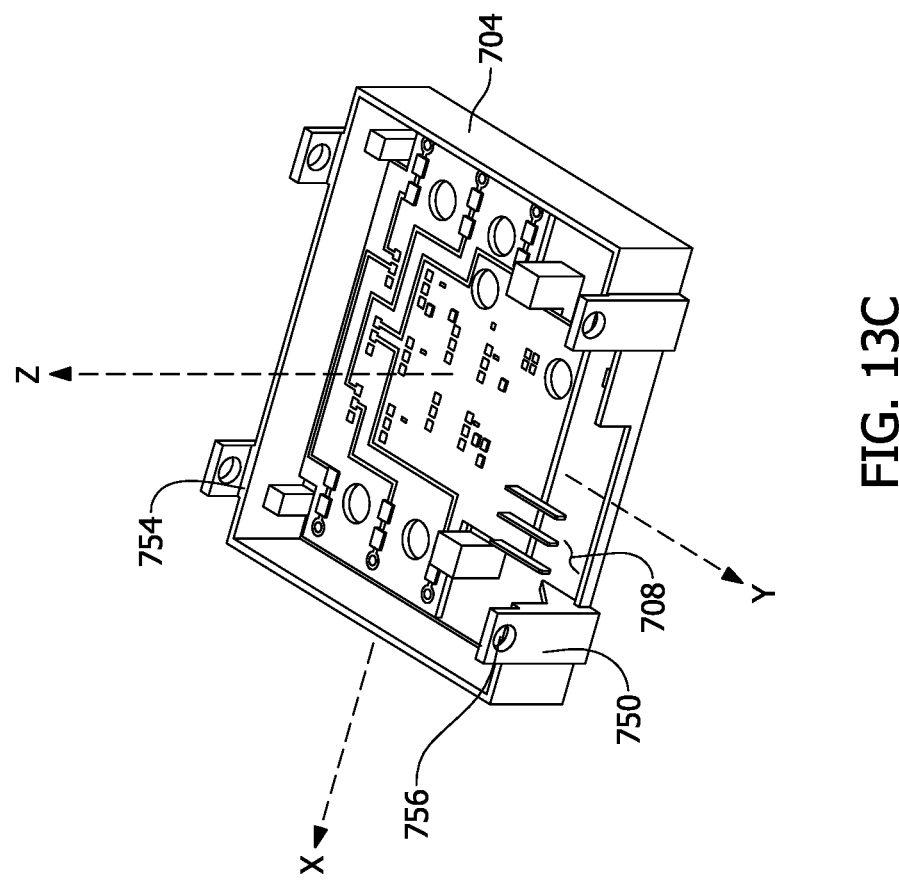
FIG. 13C is a perspective view of a second housing of the fuse monitoring assembly shown in FIG. 13A.

FIGS. 13A-13C shows another exemplary fuse monitoring assembly 700 for use with system 100 shown in FIGS. 1A-1B. The assembly 700 includes a housing 702 having a first housing 704 and a second housing 706 that are selectively connected together to define a housing cavity 708 between the first housing 704 and the second housing 706. An exterior region 710 is defined outside of the housing. The housing cavity 708 stores the circuitry of the assembly, e.g., sensors 120, circuit board 440. The first housing 704 and the second housing 706 defines one or more openings 712 which allow a portion of the sensors 120 stored within the housing cavity 708 to extend to the exterior region 710 to be operable engaged with a fuse 110 and/or the fuse block 112. The assembly 700 includes a vertical axis Z, a first horizontal axis X and second horizontal axis Y.

The assembly 700, similar to the fuse monitoring device 116, includes include a holder attachment mechanism 720, a housing attachment mechanism 722, and a mounting attachment mechanism (not shown). The holder attachment mechanism 720 connects the fuse block 112 to the first housing 704. The housing attachment mechanism 722 connects the first housing 704 to the second housing 706. The mounting attachment mechanism connects the housing 702 to a mounting structure, e.g., such as mounting structure 250. The mounting attachment mechanism is substantially similar to the mounting attachment mechanism 322. Each of the attachment mechanism are any suitable mechanism that enable connections to be performed quickly, e.g., under 10 min, and without the use of tools.

In reference to FIG. 13B, the first housing 704 includes a wall 730. The first housing 704 includes one or more cross-members 732 defining one or more recessed portions 734. The cross-members 732 are sized and shaped such that the recessed portions 734 are sized and shaped to receive at least a portion of the fuse block 112 therein. The first housing 704 includes one or more alignment features 736 that guide the connection of the fuse block 112 as it is connected to the first housing 704. For example, during a retrofitting process, the fuse block 112 and the first housing 704 may be pressed together, substantially in a direction along the vertical axis Z to connect the first housing 704 to the fuse blocks 112. The second housing 706 includes a base 746 and a wall 748 surrounding and extending vertically from the base 746. The second housing 706 include a mounting flange 750 defining an opening 752 extending through the mounting flange 750. The mounting flange 750 may be formed integrally with the wall 748. The wall 748 includes an upper surface 754 upon which the first housing 704 rests on the wall 748. When the first housing 704 was resting on top of the upper surface, the mounting flange extends vertically, such that the opening 752 is aligned with an opening 756 defined on the wall 730 of the first housing 704. A pin or a screw, not shown, may be passed through the aligned openings 752 and 756 to secure the first housing 704 and the second housing 706 together.

In reference to FIG. 13B, the base 746 is connected to or formed integrally with the circuit board 440. The circuit board 440 electrically connects the one or more sensors 120, processor 118, memory 164, the transmitter 166, similar to the circuit board 440, described above.

User Computing Device

Figure 14:
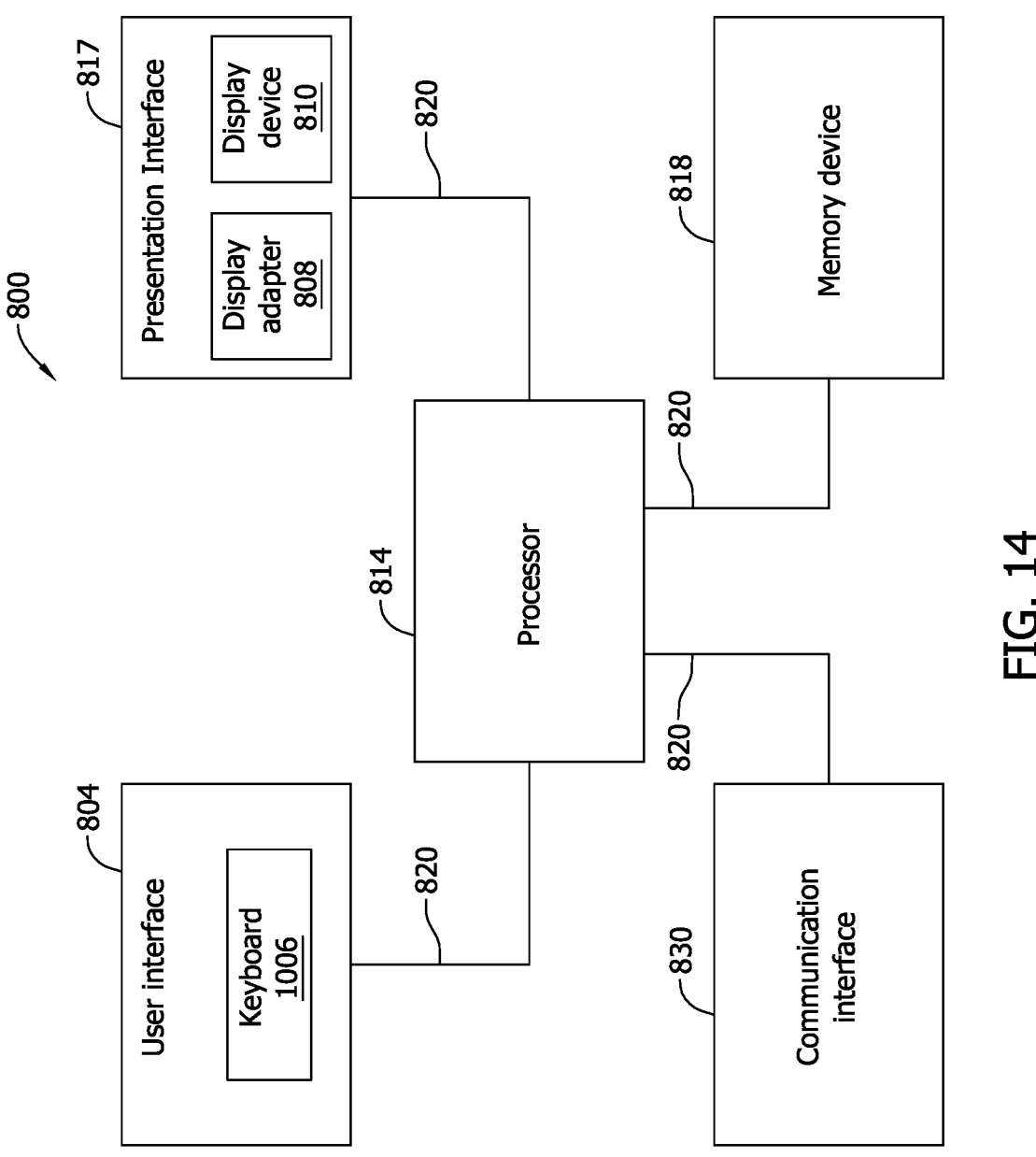
FIG. 14 is a block diagram of an exemplary user computing device.

The user computing device 150 described herein may be any suitable user computing device 800 and software implemented therein. FIG. 14 is a block diagram of an exemplary computing device 800. In the exemplary embodiment, the computing device 800 includes a user interface 804 (e.g., user interface 152) that receives at least one input from a user. The user interface 804 may include a keyboard 806 that enables the user to input pertinent information. The user interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a presentation interface 817 (e.g., user interface 152) that presents information, such as input events and/or validation results, to the user. The presentation interface 817 may also include a display adapter 808 that is coupled to at least one display device 810. More specifically, in the exemplary embodiment, the display device 810 may be a visual display device, such as a cathode ray tube (CRT), a liquid crystal display (LCD), a light-emitting diode (LED) display, and/or an "electronic ink" display. Alternatively, the presentation interface 817 may include an audio output device (e.g., an audio adapter and/or a speaker) and/or a printer.

The computing device 800 also includes a processor 814 and a memory device 818. The processor 814 is coupled to the user interface 804, the presentation interface 817, and the memory device 818 via a system bus 820. In the exemplary embodiment, the processor 814 communicates with the user, such as by prompting the user via the presentation interface 817 and/or by receiving user inputs via the user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, the memory device 818 includes one or more devices that enable information, such as executable instructions and/or other data, to be stored and retrieved. Moreover, the memory device 818 includes one or more computer readable media, such as, without limitation, dynamic random access memory (DRAM), static random access memory (SRAM), a solid state disk, and/or a hard disk. In the exemplary embodiment, the memory device 818 stores, without limitation, application source code, application object code, configuration data, additional input events, application states, assertion statements, validation results, and/or any other type of data. The computing device 800, in the exemplary embodiment, may also include a communication interface 830 that is coupled to the processor 814 via the system bus 820. Moreover, the communication interface 830 is communicatively coupled to data acquisition devices.

In the exemplary embodiment, the processor 814 may be programmed by encoding an operation using one or more executable instructions and providing the executable instructions in the memory device 818. In the exemplary embodiment, the processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Server Computing Device

Figure 15:
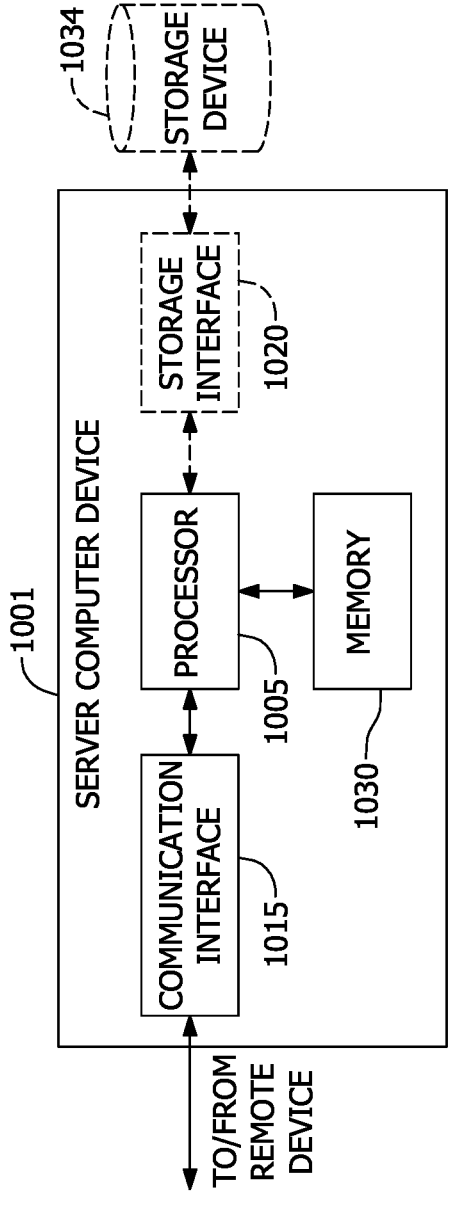
FIG. 15 is a block diagram of an exemplary server computing device.

FIG. 15 illustrates an exemplary configuration of a server computer device 1001 such as the computing device 130 The server computer device 1001 also includes a processor 1005 for executing instructions. Instructions may be stored in a memory area 1030, for example. The processor 1005 may include one or more processing units (e.g., in a multi-core configuration).

The processor 1005 is operatively coupled to a communication interface 1015 such that server computer device 1001 is capable of communicating with a remote device such as the processor 118 and/or the one or more sensor 120, or another server computer device 1001. For example, communication interface 1015 may receive data from the processor 118 and the one or more sensors 120, via the Internet.

The processor 1005 may also be operatively coupled to a storage device 1034. The storage device 1034 is any computer-operated hardware suitable for storing and/or retrieving data, such as, but not limited to, wavelength changes, temperatures, and strain. In some embodiments, the storage device 1034 is integrated in the server computer device 1001. For example, the server computer device 1001 may include one or more hard disk drives as the storage device 1034. In other embodiments, the storage device 1034 is external to the server computer device 1001 and may be accessed by a plurality of server computer devices 1001. For example, the storage device 1034 may include multiple storage units such as hard disks and/or solid state disks in a redundant array of inexpensive disks (RAID) configuration. The storage device 1034 may include a storage area network (SAN) and/or a network attached storage (NAS) system.

In some embodiments, the processor 1005 is operatively coupled to the storage device 1034 via a storage interface 1020. The storage interface 1020 is any component capable of providing the processor 1005 with access to the storage device 1034. The storage interface 1020 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing the processor 1005 with access to the storage device 1034.

In some embodiments, the processor 1005 includes a user interface 134 (shown in FIGS. 1A and 1B) that receives at least one input from a user. The user interface 134 may include a keyboard that enables the user to input pertinent information. The user interface 134 may also include, for example, a pointing device, a mouse, a stylus, a touch sensitive panel (e.g., a touch pad and a touch screen), a gyroscope, an accelerometer, a position detector, and/or an audio input interface (e.g., including a microphone). The user interface 134 may present information, such as input events and/or validation results, to the user. The user interface 134 may also include a display adapter that is coupled to at least one display device. More specifically, in the exemplary embodiment, the display device may be a visual display device, such as a cathode ray tube (CRT), a liquid crystal display (LCD), a light-emitting diode (LED) display, and/or an "electronic ink" display. Alternatively, the presentation interface 817 may include an audio output device (e.g., an audio adapter and/or a speaker) and/or a printer.

The benefits and advantages of the inventive concepts are now believed to have been amply illustrated in relation to the exemplary embodiments disclosed.

At least one technical effect of the systems and methods described herein includes (a) retrofitting a monitoring assembly onto pre-existing fuse blocks to monitor fuses within the fuse blocks; (b) connecting a monitoring assembly onto pre-existing fuse blocks without the use of tools; (d) real-time monitoring of fuses; (e) fuse monitoring using at least one sensor configured to measure operational paraments and environmental conditions; and (g) providing a user with preventive or proactive measures to protect electrical power systems based on the performance and remaining life of the fuse obtained during fuse monitoring.

An embodiment of A fuse monitoring device for monitoring a fuse supported by a fuse block, the fuse monitoring device including a housing. The housing includes a holder attachment mechanism configured to connect the fuse monitoring device to a fuse block. The housing also includes a mounting attachment mechanism configured to connect the fuse monitoring device to a mounting structure and at least one sensor configured to be operably connected to a fuse and configured to measure fuse data associated with the fuse. The monitoring device further includes at least one processor communicatively coupled to the at least one sensor. The at least one processor is configured to transmit the fuse data. In some embodiments, the fuse monitoring device is modular. In some embodiments, the at least one sensor includes a voltage sensor. The voltage sensor includes leads configured to be operably connected to the fuse block and a first portion extending from the leads through the fuse block and coupling the voltage sensor with the housing. In some embodiments, the at least one sensor includes a current transformer. In some embodiments, the fuse monitoring device has a footprint that is the same as a footprint of the fuse block. In some embodiments, the fuse monitoring device is configured to be connected to a mounting structure via the mounting attachment mechanism without use of a tool and the fuse monitoring device is configured to be connected to the fuse block via the holder attachment mechanism without use of a tool. In some embodiments the housing further comprises a first housing, a second housing, and a housing attachment mechanism, and the housing attachment mechanism is configured to connect the first housing and the second housing together without use of a tool. In some embodiments, the mounting structure is a DIN rail, the fuse block includes a holder attachment configured to couple the fuse block to the DIN rail, and the holder attachment mechanism of the fuse monitoring device is configured to couple with the holder attachment of the fuse block. Furthermore, in some embodiments, the fuse monitoring device is connected as Internet of Things (IoT).

In yet another embodiment, a fuse monitoring system is fully disclosed. The system includes a fuse monitoring assembly. The fuse monitoring assembly includes a fuse monitoring device. The fuse monitoring device includes a housing comprising a holder attachment mechanism configured to connect the fuse monitoring device to a fuse block and a mounting attachment mechanism configured to connect the fuse monitoring device to a mounting structure. The fuse monitoring device includes at least one sensor configured to be operably connected to a fuse and configured to measure fuse data associated with the fuse and at least one processor communicatively coupled to the at least one sensor. The at least one processor is configured to transmit the fuse data. The assembly further includes a fuse monitoring computing device configured to receive the fuse data from the at least one processor. The fuse monitoring computing device includes at least one processor in communication with at least one memory device. In some embodiments, the fuse monitoring device is modular. In some embodiments, the at least one sensor includes a voltage sensor. The voltage sensor includes leads configured to be operably connected to the fuse block and a first portion extending from the leads through the fuse block and coupling the voltage sensor with the housing. In some embodiments, the at least one sensor includes a current transformer. In some embodiments, the fuse monitoring device has a footprint that is the same as a footprint of the fuse block. In some embodiments, the fuse monitoring device is configured to be connected to a mounting structure via the mounting attachment mechanism without use of a tool and the fuse monitoring device is configured to be connected to the fuse block via the holder attachment mechanism without use of a tool. In some embodiments the housing further comprises a first housing, a second housing, and a housing attachment mechanism, and the housing attachment mechanism is configured to connect the first housing and the second housing together without use of a tool. In some embodiments, the mounting structure is a DIN rail, the fuse block includes a holder attachment configured to couple the fuse block to the DIN rail, and the holder attachment mechanism of the fuse monitoring device is configured to couple with the holder attachment of the fuse block. Furthermore, in some embodiments, the fuse monitoring device is connected as Internet of Things (IoT).

While exemplary embodiments of components, assemblies and systems are described, variations of the components, assemblies and systems are possible to achieve similar advantages and effects. Specifically, the shape and the geometry of the components and assemblies, and the relative locations of the components in the assembly, may be varied from that described and depicted without departing from inventive concepts described. Also, in certain embodiments, certain components in the assemblies described may be omitted to accommodate particular types of fuses or the needs of particular installations, while still providing the needed performance and functionality of the fuses.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A fuse monitoring device for monitoring a fuse, the fuse monitoring device comprising:
   at least one sensor configured to be operably connected to the fuse and configured to measure fuse data associated with the fuse, wherein the at least one sensor includes a current sensor that comprises a frame and a core, wherein the frame is t-shaped;
   at least one processor communicatively coupled to the at least one sensor, the at least one processor configured to transmit the fuse data; and
   a housing comprising a holder attachment mechanism configured to connect the fuse monitoring device to a fuse block that supports the fuse and the housing further comprising a mounting block, wherein the mounting block comprises a chamber, wherein a lower member of the t-shaped frame of the current sensor is configured within the chamber of the mounting block.

2. The fuse monitoring device of claim 1, wherein the frame comprises an upper member that is perpendicular to the lower member, wherein the upper member is connected to the core.

3. The fuse monitoring device of claim 1, wherein the frame is configured to mount the current sensor to the housing.

4. The fuse monitoring device of claim 1, wherein the frame comprises a frame channel through which one or more wire components of the current sensor is directed through.

5. The fuse monitoring device of claim 4, wherein the one or more wire components of the current sensor exits through a lower opening of the lower member.

6. The fuse monitoring device of claim 4, wherein the one or more wire components electrically connects the core and a circuit board of the housing via the frame channel.

7. The fuse monitoring device of claim 6, wherein the circuit board is configured within a housing cavity.

8. The fuse monitoring device of claim 1, wherein the housing comprises a housing cavity for storing the at least one processor.

9. The fuse monitoring device of claim 1, wherein the frame is coupled to the core using screws, pins, or adhesives.

10. A fuse monitoring system comprising:
    a fuse monitoring device for monitoring a fuse, the fuse monitoring device comprising:
       at least one sensor configured to be operably connected to the fuse and configured to measure fuse data associated with the fuse, wherein the at least one sensor includes a current sensor that comprises a frame and a core, wherein the frame is t-shaped;
       at least one processor communicatively coupled to the at least one sensor, the at least one processor configured to transmit the fuse data; and
       a housing comprising a holder attachment mechanism configured to connect the fuse monitoring device to a fuse block that supports the fuse and the housing further comprising a mounting block, wherein the mounting block comprises a chamber, wherein a lower member of the t-shaped frame of the current sensor is configured within the chamber of the mounting block; and
    a computing device configured to receive the fuse data from the at least one processor that is in communication with at least one memory device.

11. The fuse monitoring system of claim 10, wherein the frame comprises an upper member that is perpendicular to the lower member, wherein the upper member is connected to the core.

12. The fuse monitoring system of claim 10, wherein the frame is configured to mount the current sensor to the housing.

13. The fuse monitoring system of claim 10, wherein the frame comprises a frame channel through which one or more wire components of the current sensor is directed through.

14. The fuse monitoring system of claim 13, wherein the one or more wire components of the current sensor exits through a lower opening of the lower member.

15. The fuse monitoring system of claim 13, wherein the one or more wire components electrically connects the core and a circuit board of the housing via the frame channel.

16. The fuse monitoring system of claim 15, wherein the circuit board is configured within a housing cavity.

17. The fuse monitoring system of claim 10, wherein the housing comprises a housing cavity for storing the at least one processor.

18. The fuse monitoring system of claim 10, wherein the fuse monitoring device is configured to connect to a plurality of fuse blocks.

19. The fuse monitoring system of claim 10, wherein the frame is coupled to the core using screws, pins, or adhesives.

* * * * *